United States Patent
Ide et al.

(10) Patent No.: US 12,381,102 B2
(45) Date of Patent: Aug. 5, 2025

(54) SUBSTRATE PROCESSING APPARATUS AND SUBSTRATE PROCESSING METHOD

(71) Applicant: Tokyo Electron Limited, Tokyo (JP)

(72) Inventors: Kousei Ide, Kumamoto (JP); Naruaki Iida, Kumamoto (JP); Kazuya Matsushita, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 429 days.

(21) Appl. No.: 17/889,520

(22) Filed: Aug. 17, 2022

(65) Prior Publication Data

US 2023/0056038 A1 Feb. 23, 2023

(30) Foreign Application Priority Data

Aug. 17, 2021 (JP) .................................. 2021-132910

(51) Int. Cl.
*H01L 21/677* (2006.01)
*H01L 21/67* (2006.01)

(52) U.S. Cl.
CPC .. *H01L 21/67745* (2013.01); *H01L 21/67173* (2013.01); *H01L 21/67178* (2013.01); *H01L 21/67196* (2013.01)

(58) Field of Classification Search
None
See application file for complete search history.

(56) References Cited

U.S. PATENT DOCUMENTS

| | | | | |
|---|---|---|---|---|
| 6,377,329 B1* | 4/2002 | Takekuma | ........ | H01L 21/67748 355/30 |
| 7,497,912 B2* | 3/2009 | Koyama | ........... | H01L 21/67276 156/345.31 |
| 7,959,395 B2* | 6/2011 | Hofmeister | ....... | H01L 21/67161 414/217 |
| 8,443,513 B2* | 5/2013 | Ishida | ............... | H01L 21/67178 414/217 |
| 9,443,749 B2* | 9/2016 | Wakabayashi | .... | H01L 21/67196 |
| 9,862,554 B2* | 1/2018 | Caveney | ........... | H01L 21/67196 |

FOREIGN PATENT DOCUMENTS

JP 2008-258208 A 10/2008

* cited by examiner

*Primary Examiner* — Michael S Lowe
(74) *Attorney, Agent, or Firm* — Nath, Goldberg & Meyer; Jerald L. Meyer; Tanya E. Harkins

(57) ABSTRACT

A substrate processing apparatus includes: a loading/unloading block; a processing station provided on one of left and right sides of the loading/unloading block; a relay block provided on one of left and right sides of the processing station; processing blocks provided side by side in a left-right direction to form the processing station, each of the processing blocks including a processing module configured to perform a process on the substrate and a main transfer mechanism configured to deliver the substrate to the processing module; and bypass transfer mechanisms provided separately from the main transfer mechanism and provided respectively for the processing blocks arranged side by side in the left-right direction to transfer the substrate between left and right blocks, wherein bypass transfer paths for the substrate transferred by the plurality of bypass transfer mechanisms have heights different from each other, and partially overlap each other in a plan view.

10 Claims, 17 Drawing Sheets

SUBSTRATE PROCESSING APPARATUS AND SUBSTRATE PROCESSING METHOD

CROSS-REFERENCE TO RELATED APPLICATION

This application is based upon and claims the benefit of priority from Japanese Patent Application No. 2021-132910, filed on Aug. 17, 2021, the entire contents of which are incorporated herein by reference.

TECHNICAL FIELD

The present disclosure relates to a substrate processing apparatus and a substrate processing method.

BACKGROUND

In a process of manufacturing a semiconductor device, a semiconductor wafer (hereinafter referred to as a wafer) is transferred between various processing modules and is subjected to various processes such as a liquid process, a heating process, and the like. Patent Documents 1 discloses a coating/developing apparatus that includes processing blocks S2 and S4 each including a plurality of unit blocks respectively provided with a plurality of processing modules and stacked one above another, and main arms provided for the respective unit blocks and configured to transfer wafers between the processing modules. The processing blocks S2 and S4 are sandwiched between a carrier block and an exposure apparatus, and a block S3 for moving wafers up and down is interposed between the processing blocks S2 and S4. Further, a plurality of shuttle arms for transferring wafers without going through the processing modules is provided, as transfer mechanisms different from the main arms, in lower unit blocks of the processing blocks S2 and S4, respectively.

The wafers transferred to the block S3 using the shuttle arm of the processing block S2 are distributed to upper unit blocks of the processing blocks S2 and S4. Then, the wafers are returned to the block S3 and transferred to the exposure apparatus by using the shuttle arm of the processing block S4. Thereafter, when processing is performed on one of the processing blocks S2 and S4, the wafers are transferred toward the carrier block by the shuttle arm so as to bypass the processing module of the block in which processing is not performed.

PRIOR ART DOCUMENT

Patent Document

Patent Document 1: Japanese Laid-Open Patent Publication No. 2008-258208

SUMMARY

According to one embodiment of the present disclosure, there is provided a substrate processing apparatus, including: a loading/unloading block in which a substrate is loaded and unloaded; a processing station provided on one of left and right sides of the loading/unloading block, and in which the substrate is transferred to and from the loading/unloading block; a relay block provided on one of left and right sides of the processing station, and in which the substrate is transferred to and from the processing station; a plurality of processing blocks provided side by side in a left-right direction to form the processing station, each of the plurality of processing blocks including at least one processing module configured to perform a process on the substrate and a main transfer mechanism configured to deliver the substrate to the at least one processing module; and a plurality of bypass transfer mechanisms provided separately from the main transfer mechanism and provided respectively for the plurality of processing blocks arranged side by side in the left-right direction to transfer the substrate between left and right blocks, wherein bypass transfer paths, which are transfer paths for the substrate transferred by the plurality of bypass transfer mechanisms, have heights different from each other, and partially overlap each other in a plan view.

BRIEF DESCRIPTION OF DRAWINGS

The accompanying drawings, which are incorporated in and constitute a portion of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Figure 2:
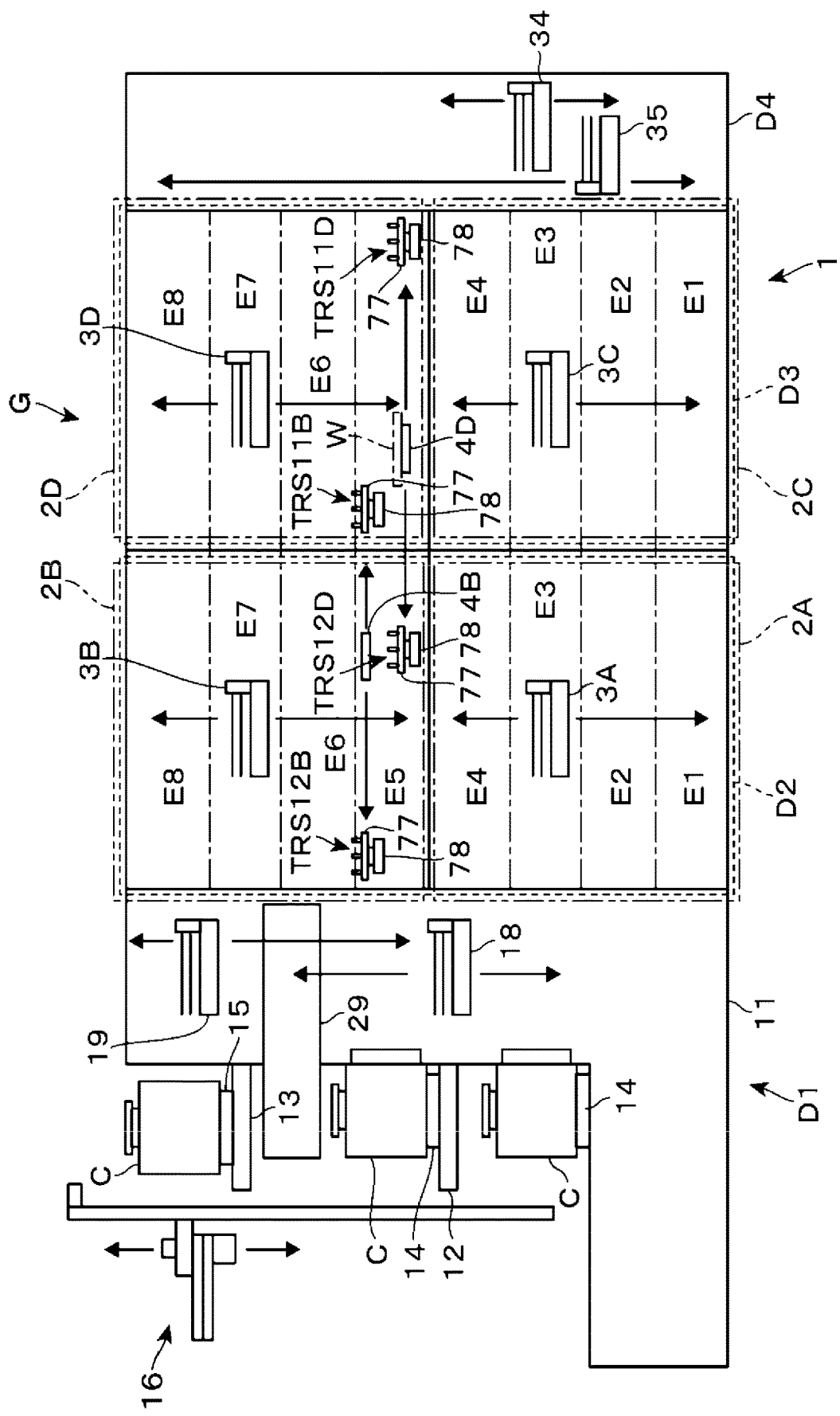
FIG. 2 is a vertical sectional front view of the substrate processing apparatus.
Figure 3:
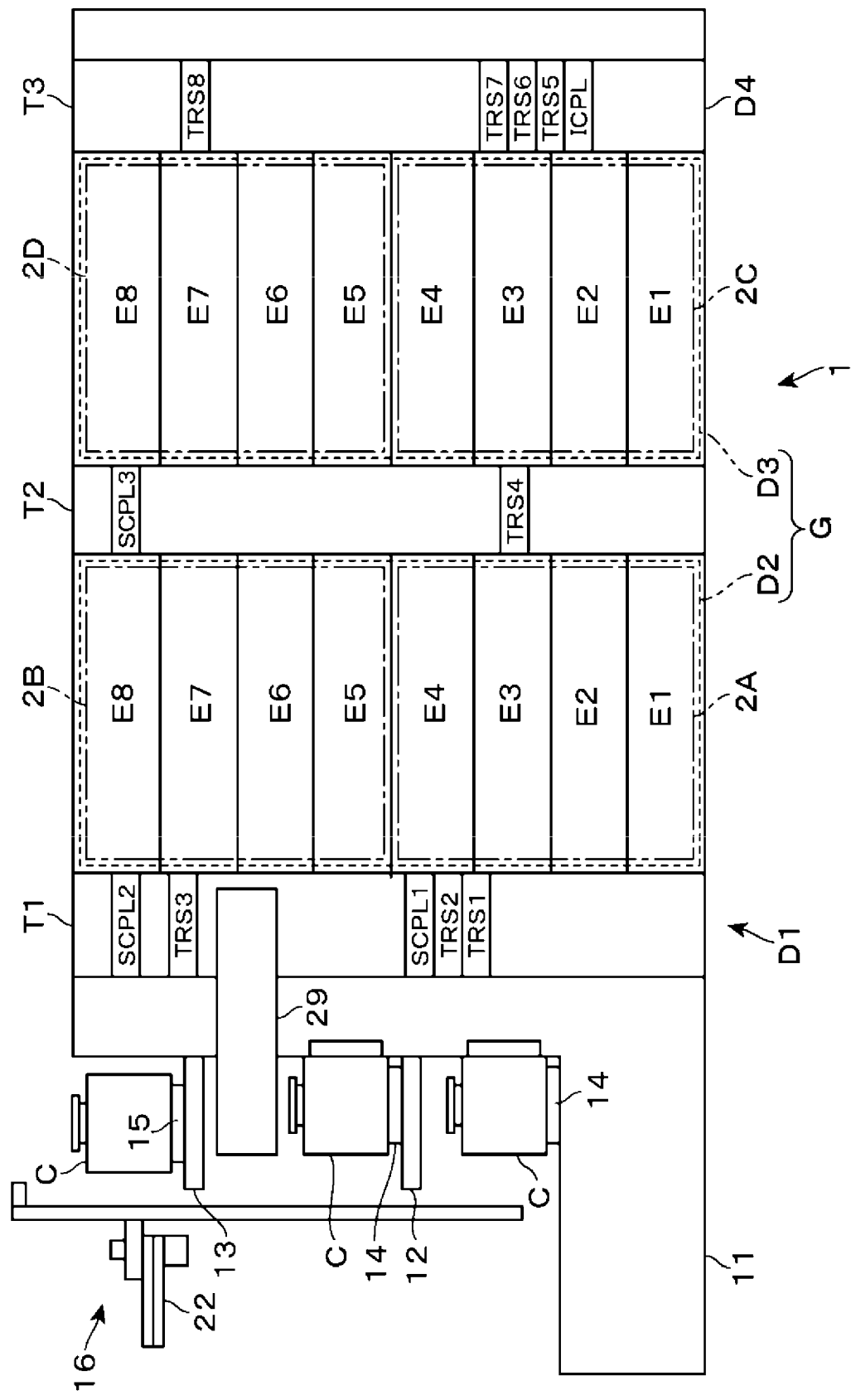
FIG. 3 is a vertical sectional front view of the substrate processing apparatus.

A substrate processing apparatus 1 according to a first embodiment of the present disclosure will be described with reference to a sectional plan view of FIG. 1 and vertical sectional front views of FIGS. 2 and 3. FIGS. 2 and 3 show cross sections of the apparatus at different positions. In the substrate processing apparatus 1, a carrier block D1, a first multilayered processing block D2, a second multilayered processing block D3 and an interface block D4 are arranged in the named order along a straight line in a horizontal direction. Adjacent ones of the blocks (the carrier block, the first multilayered processing block, the second multilayered processing block and the interface block) D1 to D4 are connected to each other. Further, the blocks D1 to D4 are provided with housings and are partitioned from each other. A transfer region for a wafer W, which is a circular substrate, is formed inside each housing.

The arrangement direction of the blocks D1 to D4 is referred to as a left-right direction. For the sake of convenience in description, the carrier block D1 side is assumed to be a left side, and the interface block D4 side is assumed to be a right side. Further, when the carrier block D1 is assumed to be on the left side, a front side in a front-rear direction of the apparatus is assumed to be the front side, and a rear side in the front-rear direction of the apparatus is assumed to be the rear side. An exposure machine 20 is connected to the interface block D4, which is a relay block, from the right side.

Prior to describing each of the blocks D1 to D4 in detail, a schematic configuration of the substrate processing apparatus 1 will be described. Wafers W are transferred to the carrier block D1 in a state of being stored in, for example, a carrier C called a FOUP (Front Opening Unified Pod). A resist film is formed on a surface of each of the wafers W. The substrate processing apparatus 1 includes a processing module PM (see FIG. 4) that performs various processes such as a cleaning process as a liquid process and a developing process, which are liquid processes, a heating process for the wafer W (PEB: Post Exposure Bake) performed after exposure and before the developing process, and the like. The wafer W is delivered to the exposure machine 20 in order to expose the resist film before performing the PEB.

The first multilayered processing block D2 and the second multilayered processing block D3 constitute a processing station G in which various processes including the liquid process are performed. Each of the first multilayered processing block D2 and the second multilayered processing block D3 is partitioned so as to be divided into two blocks in the vertical direction. Each of the partitioned blocks constitute a processing block including a processing module and a main transfer mechanism capable of performing delivery with respect to the processing module. Lower and upper sides of the first multilayered processing block D2 divided into two blocks as described above are referred to as a processing block 2A and a processing block 2B, respectively. Lower and upper sides of the second multilayered processing block D3 divided into two blocks are referred to as a processing block 2C and a processing block 2D, respectively.

The processing blocks 2A and 2C are adjacent to each other, and may be collectively referred to as lower processing blocks. Further, the processing blocks 2B and 2D are adjacent to each other, and may be collectively referred to as upper processing blocks. In FIG. 1, there are shown the upper processing blocks. Each of the processing blocks 2B and 2D, which are the upper processing blocks, is provided with a transfer mechanism (bypass transfer mechanism) different from the main transfer mechanism. This transfer mechanism will be referred to as a shuttle in the following description. The shuttle transfers the wafer W toward the block on the downstream side of a transfer route so as not to pass through the processing modules.

The lower processing blocks form an outgoing path for transferring the wafer W from the carrier block D1 to the interface block D4. The upper processing blocks form a return path for transferring the wafer W exposed in the exposure machine 20 from the interface block D4 to the carrier block D1. In the return path, the wafer W is transferred to the processing module by the transfer mechanism in one of the processing blocks 2B and 2D so that the wafer W is subjected to processing, and is transferred by the shuttle in the other processing block. That is, the return path has two transfer routes, and the wafer W is transferred through one of the two transfer routes. The term "module" refers to a place where the wafer W is placed, other than the transfer mechanism (including the shuttle). The module for processing the wafer W is described as a processing module as described above. The processing includes acquiring an image for inspection.

Hereinafter, each block will be described. The carrier block D1 is a loading/unloading block that loads and unloads the wafer W with respect to the carrier C for storing the wafer W. On the left side surface of the housing constituting the carrier block D1, three support bases for supporting the carrier C are provided side by side in the vertical direction. The three support bases will be denoted as support bases 11, 12 and 13 sequentially from the lower side. Each of the support bases 11 to 13 is provided with four carrier stages arranged in the front-rear direction. The two stages on the front side of each of the support bases 11 and 12 are stages 14 on which the carriers C are placed in order to load and unload the wafer W into and from the apparatus. The remaining stages are configured as stages for loading and unloading the carriers C into and from the substrate processing apparatus 1, or stages for temporarily retracting the carriers C when the transfer of the carriers C to the transfer destination is not possible. These stages are shown as stages 15. A transfer mechanism 16 for transferring the carrier C between the stages 14 and 15 is provided.

Transfer mechanisms 18 and 19 are provided on the front side and the rear side of a transfer region 17 in the housing of the carrier block D1, respectively. A module stack T1 is provided so as to be sandwiched between the transfer mechanisms 18 and 19 in a plan view. The module stack T1 is configured by vertically overlapping a delivery module TRS on which the wafer W is temporarily placed, a temperature control module SCPL for adjusting a temperature of the placed wafer W, and the like. Other module stacks described later have the same configuration. In this specification, when the modules overlap each other in a plan view, they form a stack even if they are separated from each other.

The temperature adjustment module SCPL may adjust the temperature of the placed wafer W, and the wafer W is delivered to the temperature adjustment module SCPL by an elevating operation of the transfer mechanism. The delivery module TRS is provided with, for example, a plurality of pins arranged in the horizontal direction, and the wafer W is delivered to the pins by the elevating operation of the transfer mechanism. The TRS and SCPL are provided so as to form a module stack even in the blocks other than the carrier block D1. Some of the modules constituting each module stack have a role of delivering the wafer W between the blocks. The TRS for shuttle that transfers the wafer W to and from the shuttle may be raised and lowered unlike the above configuration. Details will be described together with the shuttle. In the following description, in order to distinguish the SCPLs and the TRSs at different locations from each other, numerals are added after the SCPLs and the TRSs. The modules constituting the module stack T1 are indicated as TRS1, TRS2, SCPL1, TRS3 and SCPL2 from the lower side toward the upper side.

The SCPL1 is located at a height of the lower processing blocks to form the outgoing path, and the TRS3 and the SCPL2 are located at a height of the upper processing blocks to form the return path. The TRS1 and the TRS2 are used for delivering the wafer W between the transfer mechanisms 18 and 19. The transfer mechanism 18 is accessible to the TRS1 and the TRS2, and the transfer mechanism 19 is accessible to the TRS1 to the TRS3, the SCPL1 and the TRS12B for shuttle so that the wafer W can be transferred along the transfer route shown in FIG. 14. A pre-process inspection module 29 is provided between the modules constituting the module stack T1, and a portion of the pre-process inspection module 29 protrudes outward of the housing of the block. The pre-process inspection module 29 acquires images for inspection of the wafer W which is not yet processed by the substrate processing apparatus 1. The transfer mechanism 18 is also accessible to the pre-process inspection module 29.

Figure 4:
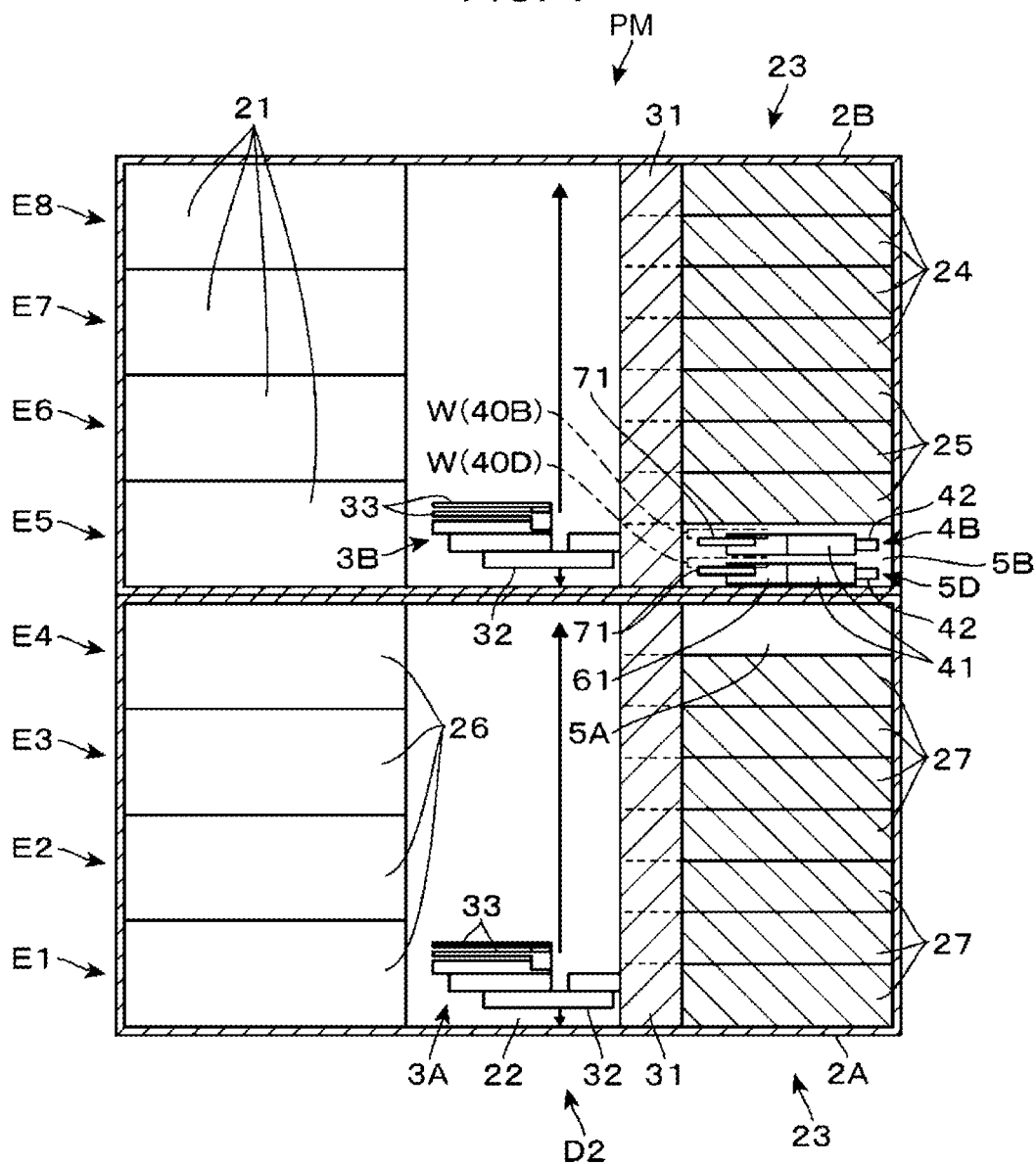
FIG. 4 is a vertical sectional side view of the substrate processing apparatus.

Next, the first multilayered processing block D2 (the processing blocks 2A and 2B) will be described with further reference to FIG. 4, which is a vertical sectional side view. The front side of the first multilayered processing block D2 is divided in the vertical direction to form eight stories. The respective stories are denoted as E1 to E8 from the lower side toward the upper side. The lower stories E1 to E4 are included in the processing block 2A, and the upper stories E5 to E8 are included in the processing block 2B. Each of the stories is a region where a liquid processing module can be installed.

First, the processing block 2B will be described. In each of the stories E5 to E8, a developing module 21 for supplying a developing liquid to the wafer W is provided as a liquid processing module. A transfer region 22 for wafer W is provided on the rear side of the stories E5 to E8. The transfer region 22 is formed linearly in a plan view from the left end to the right end of the processing block 2B and from the height of the story E5 to the height of the story E8. On the rear side of the transfer region 22, for example, seven processing modules are stacked in the vertical direction to provide a processing module stack 23. Two processing module stacks 23 are provided at intervals on the left and right. The two processing module stacks 23 include a heating module 24 for performing PEB and a post-process inspection module 25. The post-process inspection module 25 is similar to the pre-process inspection module 29 except that an image acquisition target is the wafer W subjected to processing in the apparatus.

The processing block 2B is provided with a main transfer mechanism 3B. The main transfer mechanism 3B includes a support column 31, a main body portion 32, and a holding portion 33 for holding the wafer W. The support column 31 that supports the main body portion 32 extends vertically from the lower end to the upper end of the processing block 2B at the left/right central portion of the processing block 2B, and is sandwiched between the two processing module stacks 23 arranged at the left and right sides. More specifically, the support column 31 is located on a front end side of a region between the two processing module stacks 23. A base end side of the main body portion 32, which is an articulated arm, is provided in the transfer region 22 by being supported on a front side surface of the support column 31, and is moved up and down along the extension direction of the support column 31. A mechanism for raising and lowering the main body portion 32 in this way is provided, for example, on the support column 31. An arm portion on the tip end side of the main body portion 32 is configured as a base for independently advancing and retreating two holding portions 33.

By the main transfer mechanism 3B, the wafer W is delivered to the respective processing modules on the processing block 2B and the module located at the same height as the processing block 2B in the module stack (T1 and T2 described later) provided in the block adjacent to the processing block 2B. The main transfer mechanism 3B may also deliver the wafer W to the below-described TRS for shuttle provided in the processing block 2B.

The lower side of the processing module stack 23 is configured as a partitioned flat space 5B. The space 5B is provided from the left end to the right end of the processing block 2B. The support column 31 is positioned so as to cut into the front end of the left/right central portion of the space 5B. Therefore, the front end portion of the left/right central portion of the space 5B is recessed backward. A shuttle 4B and TRS12B and TRS12D for shuttle are provided in the space 5B. The shuttle and the TRS for shuttle will be described in detail later.

Each processing block other than the processing block 2B described below has substantially the same configuration as that of the processing block 2B except for differences described later. Each processing block is provided with a main transfer mechanism corresponding to the main transfer mechanism 3B. This main transfer mechanism is designated by adding the same alphabetic character as that attached to the processing block instead of "B". Specifically, for the processing block "2A", the main transfer mechanism thereof is designated by "3A". Other main transfer mechanisms corresponding to the main transfer mechanism 3B are configured to deliver the wafer W to the processing module and the TRS for shuttle in the processing block provided with the main transfer mechanism, and the module stack of the processing block or the block adjacent to the processing block in the left-right direction.

Further, a space in which the shuttle can be installed and which corresponds to the space 5B described above is also designated by adding the same alphabetic character as that attached to the processing block instead of "B". Further, when the shuttle is provided in the processing block, the same alphabetic character as that attached to the processing block is added to designate the shuttle. Moreover, the TRS for the shuttle is designated by adding the same alphabetic character as that attached to the processing block in which the shuttle is provided. The TRS as a transfer source is designated by adding 11 in front of the alphabetic character, and the TRS as a transfer destination is designated by adding 12 in front of the alphabetic character. The transfer path of the wafer W transferred by the shuttle is designated by adding the same alphabetic character as that attached to the shuttle after the numeral 40. Specific examples of the above reference symbol adding rule are as follows. The shuttle provided in the processing block 2D described later is designated by 4D. The TRSs as the transfer source and the transfer destination of the shuttle 4D are designated by TRS11D and TRS12D. A transfer path of the wafer W transferred by the shuttle 4D is designated by 40D, and a space where the shuttle 4D is provided is designated by 5D.

Returning to the description of the configuration of the processing block, the processing block 2A below the processing block 2B will be described with reference to FIG. 4. The differences from the processing block 2B are that each of the stories E1 to E4 is provided with a rear surface cleaning module 26 for supplying a cleaning liquid to the rear surface of the wafer W to clean the rear surface as a liquid processing module, and further that the transfer region 22 is provided over the height of the stories E1 to E4. Further, the processing modules constituting the processing module stack 23 includes a peripheral edge exposure module 27 for removing an unnecessary resist film on a peripheral edge portion of the wafer W during development. In the processing block 2A, the space 5A is provided on the upper side instead of the lower side of the processing module stack 23. In this example, the shuttle is not provided in the space 5A. As described above, a vertical positional relationship between the space and the processing module stack 23 is different from that of the processing block 2B. Even in the processing block 2A, the support column 31 of the main transfer mechanism 3A is provided at a position sandwiched between the two processing module stacks 23. A layout of the processing module stack 23, the main transfer mechanism 3A, the transfer region 22 and the liquid processing module in a plan view is the same as that in the processing block 2B.

Next, the second multilayered processing block D3 (the processing blocks 2C and 2D) constituting the respective processing blocks on the right side of the apparatus will be described with reference to FIGS. 1 to 3. The second multilayered processing block D3 has substantially the same configuration as that of the first multilayered processing block D2. Differences from the first multilayered processing block D2 will be mainly described. First, the upper processing block 2D will be described. A positional relationship between the transfer region 22, the processing module stack 23, the main transfer mechanism, and the space for installing a shuttle stacked on the processing module is the same as that in the processing block 2B. Further, the processing module placed on the processing block 2D is the same as the processing module of the processing block 2B. The space 5D for shuttle in the processing block 2D is located at the same height as that of the space 5B so as to communicate with the space 5B. The shuttle 4D, the TRS11B and the TRS11D are provided in the space 5D.

The lower processing block 2C has substantially the same configuration as that of the lower processing block 2A. The difference is that a post-exposure cleaning module 28 for supplying a cleaning liquid to the surface of the wafer W after exposure by the exposure machine 20 and cleaning the surface of the wafer W is provided in each of the stories E1 to E4. Further, in the processing block 2C, the processes other than cleaning are not performed, and the processing module stack 23 is not provided. The space 5C is located at the same height as that of the space 5A so as to communicate with the space 5A. In this example, the shuttle is not provided in the space 5C.

The module stack T2 is provided at the left end portion of the transfer region 22 of the second multilayered processing block D3. The module stack T2 is located so that a portion of the module stack T2 is hung on the right end portion of the transfer region 22 of the first multilayered processing block D2 in a plan view. The module stack T2 includes a TRS4 located at the height of the lower processing block and a SCPL3 located at the height of the upper processing block.

The interface block D4 will be described. The interface block D4 includes a module stack T3 provided at the front/rear central portion. The module stack T3 includes TRS5 to TRS8 and a temperature control module ICPL which are stacked one above another. Immediately before the exposure performed by the exposure machine 20, the ICPL adjusts the temperature of the wafer W in the same manner as the SCPL. The TRS5 to TRS7 are provided at the height of the lower processing block, and the TRS8 is provided at the height of the upper processing block. Transfer mechanisms 34 and 35 are provided in front of and behind the module stack T3, respectively. The transfer mechanism 34 delivers the wafer W between the exposure machine 20, the TRS5, and the ICPL located below the module stack T3. The transfer mechanism 35 delivers the wafer W to each module constituting the module stack T3 and the TRS11D for shuttle of the processing block 2D.

Next, the shuttles 4B and 4D, and the TRS11B, TRS12B, TRS11D and TRS12D for shuttle will be described. By using the shuttles 4B and 4D as described above, the return path for the wafer W includes two transfer routes. In one of the transfer routes, the wafer W is transferred from the interface block D4 to the processing block 2D and is processed in the processing block 2D. Then, the wafer W is transferred from the TRS11B to the TRS12B of the processing block 2B by the shuttle 4B and is returned to the carrier block D1. In the other transfer route, the wafer W transferred from the interface block D4 to the TRS11D of the processing block 2D is transferred to the TRS12D of the processing block 2B by the shuttle 4D, processed by the processing block 2B, and returned to the carrier block D1.

Figure 1:
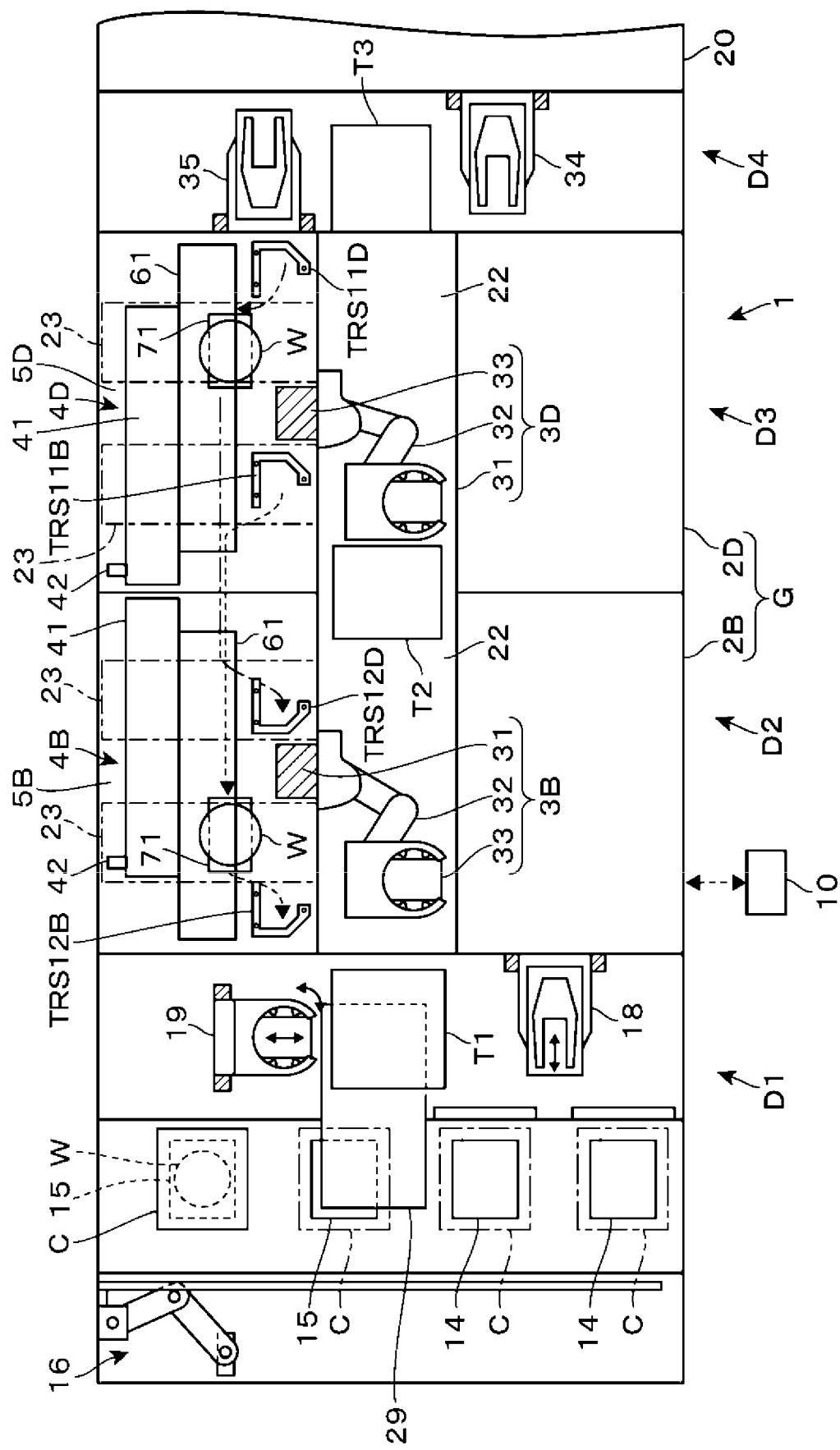
FIG. 1 is a sectional plan view of a substrate processing apparatus according to a first embodiment of the present disclosure.

As shown in FIG. 1, among the TRS11B and TRS12B for the shuttle 4B, the TRS12B at the transfer destination is provided at the left end portion of the space 5B, i.e., on the left side of the support column 31 of the main transfer mechanism 3B so that the wafer W can be delivered to and from the transfer mechanism 19 of the carrier block D1. The TRS11B at the transfer source is located on the left side of the support column 31 of the main transfer mechanism 3D and on the right side of the module stack T2 so that the increase in the size of the transfer region due to the shuttle 4B can be prevented while enabling the delivery of the wafer W to and from the main transfer mechanism 3D. Among the TRS11D and TRS12D for the shuttle 4D, the TRS11D at the transfer source is provided the right end portion of the space 5D, i.e., on the right side of the support column 31 of the main transfer mechanism 3D so that the wafer W can be delivered to and from the transfer mechanism 35 of the interface block D4. The TRS12D at the transfer destination is located on the right side of the support column 31 of the main transfer mechanism 3B and on the left side of the module stack T2 so that the increase in the size of the transfer region due to the shuttle 4D can be prevented while enabling the delivery of the wafer W to and from the main transfer mechanism 3B.

The TRS11B, TRS12B, TRS11D and TRS12D for shuttle are all provided at positions closer to the front side in the space 5B or 5D so that the wafer W can be delivered by each transfer mechanism other than the shuttle. Therefore, the support column 31 of the main transfer mechanism 3B is located on a straight line connecting the TRS11B and the TRS12B in a plan view, and the support column 31 of the main transfer mechanism 3D is located on a straight line connecting the TRS11D and the TRS12D in a plan view.

Thus, the shuttle 4B transfers the wafer W from the TRS11B to the TRS12B so as to bypass the support column 31 of the main transfer mechanism 3B, and the shuttle 4D transfers the wafer W from the TRS11D to the TRS12D so as to bypass the support column 31 of the main transfer mechanism 3D. Therefore, the transfer path 40B for the wafer W transferred by the shuttle 4B and the transfer path 40D for the wafer W transferred by the shuttle 4D form a bypass path including a front-rear movement path as well as a left-right movement path. These transfer paths 40B and 40D are horizontal transfer paths and are indicated by dotted arrows and two-dot chain arrows, respectively, in FIG. 1.

The above-mentioned transfer paths 40B and 40D are bypass transfer paths in which the wafer W is transferred by the shuttles 4B and 4D which are bypass transfer mechanisms. The TRS11B and the TRS12B, which are substrate placement portions for the shuttle, are located at one end portion and the other end portion of the transfer path 40B in the length direction because they play a role of transferring the wafer W to and from the shuttle 4B. Similarly, the TRS11D and the TRS12D, which are substrate placement portions for the shuttle, are located at one end portion and the other end portion of the transfer path 40D in the length direction because they play a role of transferring the wafer W to and from the shuttle 4D.

Hereinafter, the outline of the configuration of the shuttle 4B will be described. The shuttle 4B includes a base body 41, an intermediate moving body 61 and a wafer transfer part 71, which are moved relative to each other in the left-right direction. The base body 41 is a long member that extends to the left and right at a position closer to the rear side of the space 5B, and is fixedly provided at the position. Therefore, the position of the base body 41 with respect to the processing module stack 23 and the liquid processing module is fixed in the processing block 2B. The intermediate moving body 61 is provided on the front side of the base body 41 and is a long member extending to the left and right. The wafer transfer part 71 is provided on the front side of the intermediate moving body 61 to support and transfer the wafer W.

The intermediate moving body 61 is a moving body that can move horizontally to the left and right with respect to the base body 41. The wafer transfer part 71 can move horizontally to the left and right and back and forth with respect to the intermediate moving body 61. The movement of the intermediate moving body 61 to the left and the movement of the wafer transfer part 71 to the left are performed together, and the movement of the intermediate moving body 61 to the right and the movement of the wafer transfer part 71 to the right are performed together. Further, the front-rear position of the wafer transfer part 71 is changed according to the left-right position with respect to the wafer transfer part 71, so that the wafer W is transferred between the TRS11B and the TRS12B described above. Both the movement of the intermediate moving body 61 and the movement of the wafer transfer part 71 are performed by using the motor 42 provided in the base body 41 as a power source.

Figure 5:
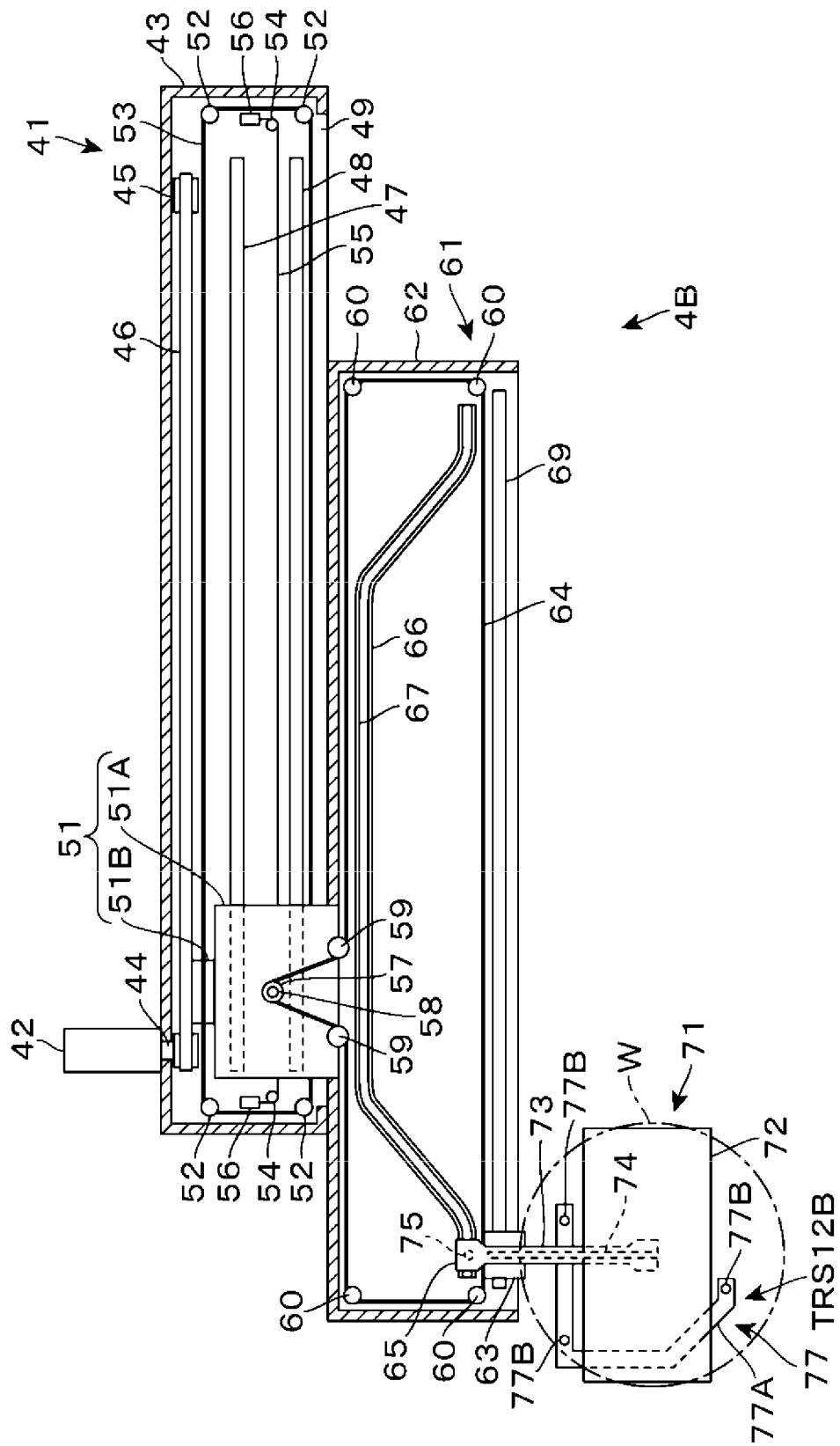
FIG. 5 is a transverse plan view of a shuttle provided in the substrate processing apparatus.
Figure 6:
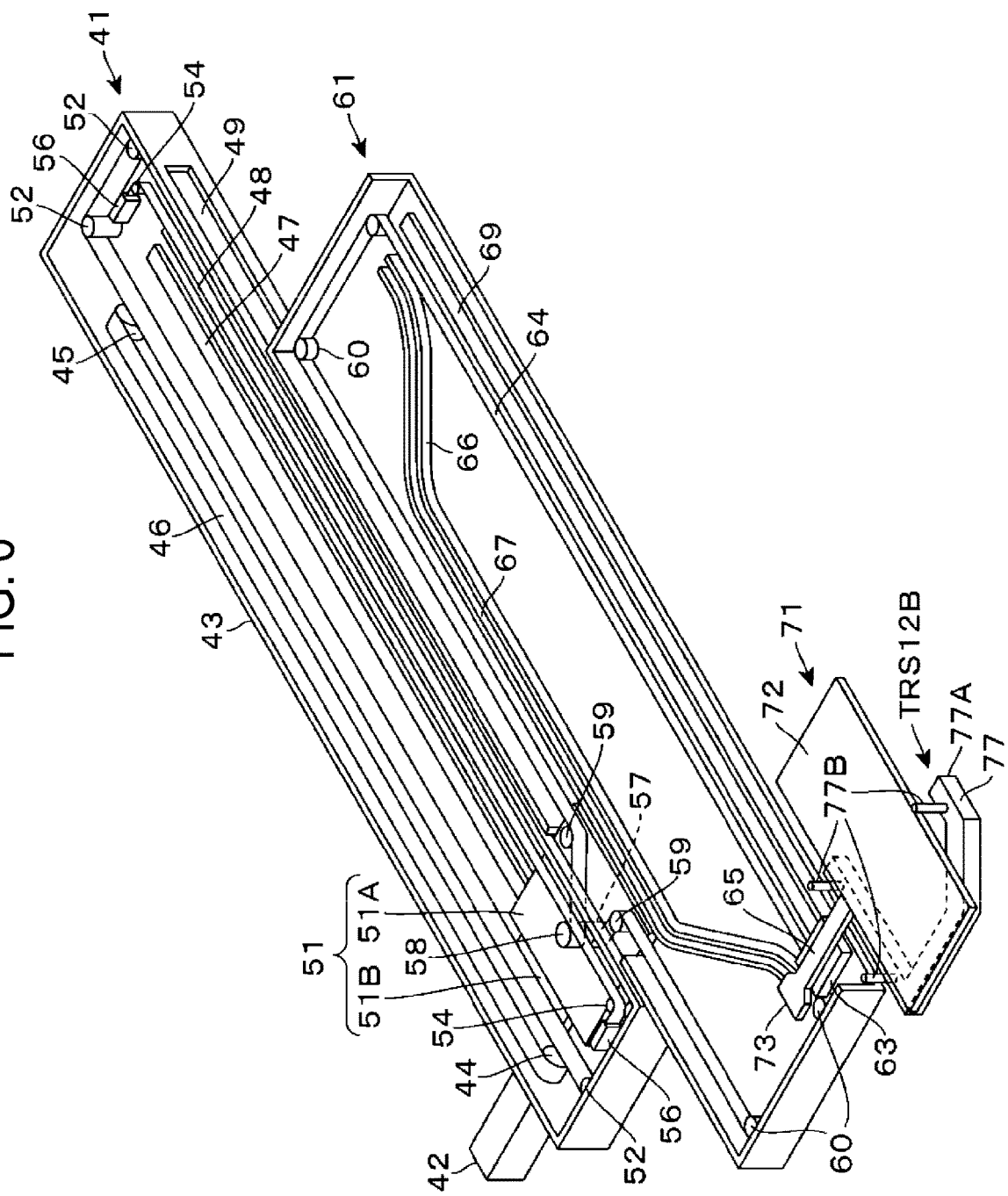
FIG. 6 is a perspective view of the shuttle.

Hereinafter, the configuration of each part of the shuttle 4B will be described in detail with reference to a plan view of FIG. 5 and a schematic perspective view of FIG. 6. In FIGS. 5 and 6, the upper side of the base body 41 and the intermediate moving body 61 is cut out to show the interior thereof. The base body 41 is provided with a square housing 43 elongated in the left-right direction. A motor 42 is provided so as to protrude rearward from the left end portion of the housing 43. Pulleys 44 and 45 are provided at the left end portion and the right end portion on the rear end side in the housing 43, respectively. The pulleys 44 and 45 can rotate about a horizontal axis extending back and forth. An endless belt 46 is wound around the pulleys 44 and 45. The pulley 44 is connected to the motor 42. The motor 42 rotates the belt 46 via the pulleys 44 and 45.

Guide rails 47 and 48 extending linearly to the left and right are provided inside the housing 43 on the front side of the position where the belt 46 is provided. The guide rails 47 and 48 are provided so as to be parallel to each other in a spaced-apart relationship in the front-rear direction. The guide rail 47 is provided at the center of the housing 43 in the front-rear direction, and the guide rail 48 is provided near the front side of the housing 43. A slider 51 is provided inside the housing 43. The slider 51 includes a main body portion 51A forming a square base and a connection portion 51B protruding rearward from the main body portion 51A. The main body portion 51A is connected to the guide rails 47 and 48, and the connection portion 51B is connected to the belt 46. By the rotation of the belt 46 described above, the slider 51 is horizontally moved in the left-right direction along the guide rails 47 and 48. The reason for providing the two guide rails connected to the slider 51 at the positions described above is the ensure high rigidity for the base body 41 supporting the intermediate moving body 61 and the wafer transfer part 71 on the front side to suppress distortion thereof and to more reliably transfer the wafer W to a desired position.

A slit 49 extending in the left-right direction and opened into the housing 43 is formed on the front side surface of the housing 43. The front side of the main body portion 51A of the slider 51 protrudes to the outside of the housing 43 through the slit 49. Inside the housing 43, rollers 52 capable of rotating about vertical axes are provided at four locations, i.e., front and rear locations on the left end side and front and rear locations on the right end side. A seal belt 53 is wound around each roller 52. One end and the other end of the seal belt 53 are connected to the left end and the right end of the main body portion 51A, respectively. As a result, the portion of the slit 49 other than the portion where the main body portion 51A is located is closed from the inside of the housing 43 by the seal belt 53. The portion of the seal belt 53 extending in the left-right direction inside the housing 43 overlaps with the connection portion 51B of the slider 51 in a plan view. However, the connection portion 51B is positioned below the seal belt 53 so as not to interfere with each other.

Further, rollers 54 capable of rotating about vertical axes are provided at the left end portion and the right end portion inside the housing 43. A belt 55 is wound around the two rollers 54 from the front side. The belt 55 is located between the two rollers 54 in parallel with the guide rails 47 and 48 and is positioned above the main body portion 51A of the slider 51. Then, one end and the other end of the belt 55 are fixed inside the housing 43 by being connected to a fixing member 56 provided behind each roller 54.

Pulleys 57 and 58 capable of rotating about vertical axes are stacked one above the other in the named order on the rear portion of the main body portion 51A. These pulleys 57 and 58 are interlocked with each other. That is, when one of the pulleys 57 and 58 rotates, the other also rotates. The belt 55 is connected to the pulley 58. When the slider 51 is moved in the left-right direction as described above, the pulley 58 rolls the belt 55, whereby the pulley 57 rotates. Further, on the front portion of the main body portion 51A, two pulleys 59 capable of rotating about vertical axes are provided so as to be spaced apart from each other in the left-right direction, and are located on the left side and the right side of the pulleys 57 and 58, respectively. The pulleys 57 and 58 are provided inside the housing 43, and the pulley 59 is provided outside the housing 43.

Next, the intermediate moving body 61 will be described. The intermediate moving body 61 includes a square housing 62. A portion of the slider 51 on front side of the main body portion 51A is inserted into the housing 62 through the opening on the rear side of the housing 62 and is fixed to the housing 62. The front side of the housing 62 is opened. This opening is formed to ensure that when the wafer transfer part 71 is moved back and forth, the wafer transfer part 71 and the wafer W can enter the housing 62 so that the housing 62 does not interfere with the front-rear movement.

A guide rail 69 extending linearly in the left-right direction is provided at the front end portion inside the housing 62. The slider 63 is connected to the guide rail 69. Pulleys 60 capable of rotating about vertical axes are provided near four corners of the housing 62. An endless belt 64 is wound around the pulley 60 and the pulleys 57 and 59 on the slider 51. The rear side of the slider 63 is connected to the belt 64. With such a configuration, when the pulley 57 on the slider 51 is rotated as described above, the belt 64 is rotated so that the slider 63 moves horizontally in the left-right direction along the guide rail 69. A groove 65 extending in the front-rear direction is formed at the upper portion of the slider 63, which is a moving body that can move to the left and right. The groove 65 is a guide paired with a guide rail 74 described later.

A curved rail 66 is provided at a position located behind the guide rail 69 inside the housing 62 and surrounded by the belt 64 in a plan view. The curved rail 66 is a rail formed so as to extend in the left-right direction between the left end portion and the right end portion inside the housing 62. A portion of the curved rail 66 extends in the front-rear direction by being curved. Describing the shape of the curved rail 66 in more detail, the left end portion and the right end portion of the linear guide rail extending to in the left-right direction are curved so as to face the front side and face the left and right sides, respectively. The tip side of the left end portion and the tip side of the right end portion curved in this way are further curved to face the left side and the right side, respectively. The curved rail 66 curved at four locations in this way has a symmetrical shape in the left-right direction. Further, a guide groove 67 is formed on the upper surface of the curved rail 66 along the extension direction of the curved rail 66.

Figure 7:
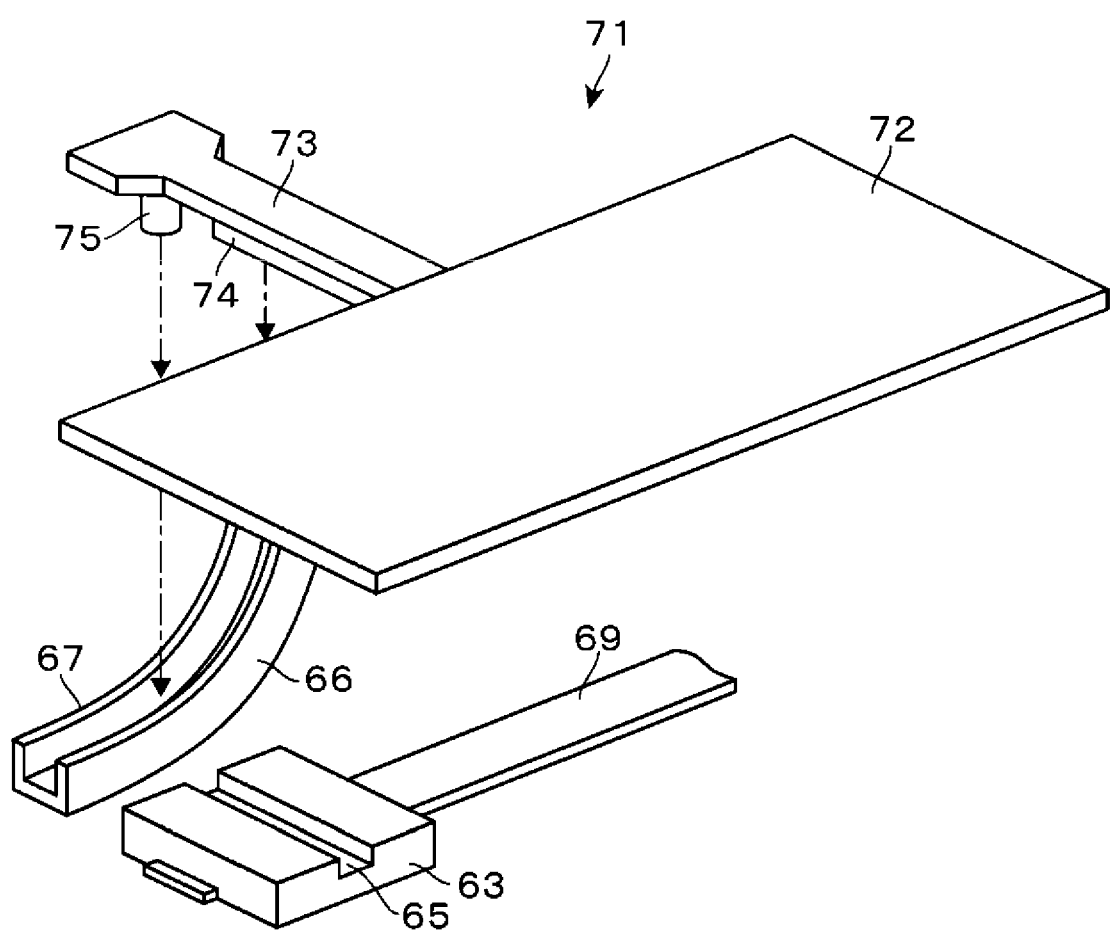
FIG. 7 is a top perspective view of a wafer transfer part provided on the shuttle.
Figure 8:
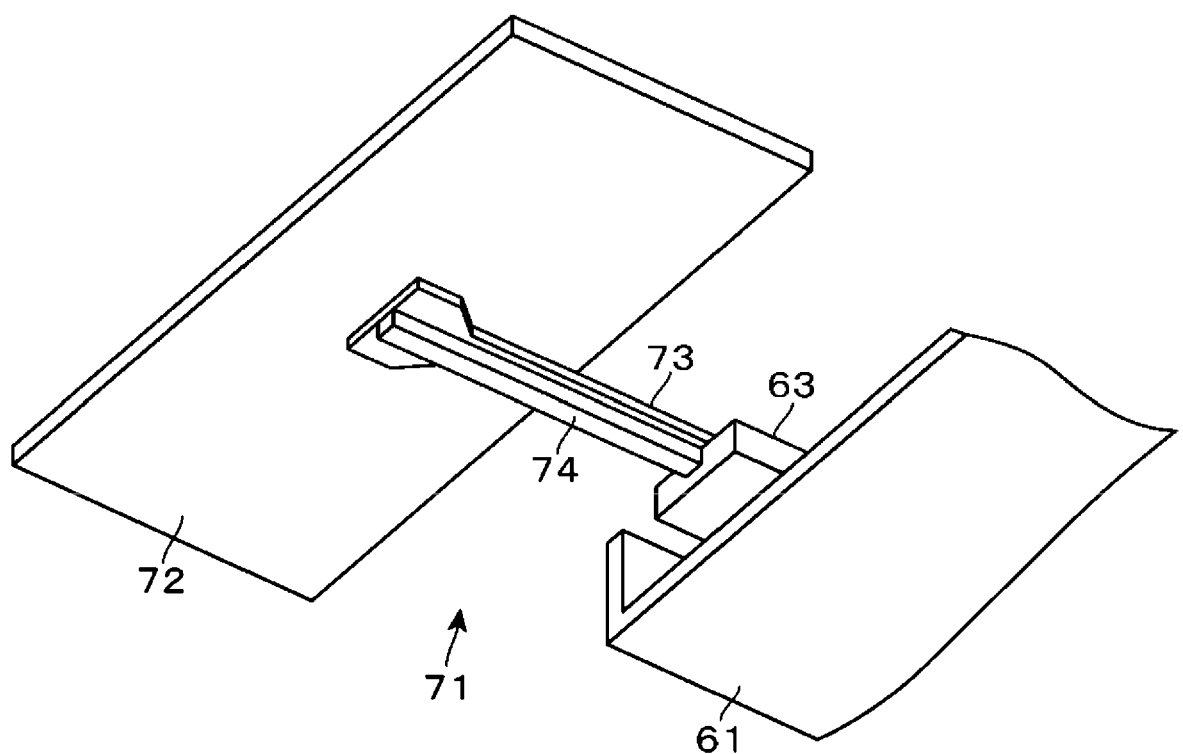
FIG. 8 is a bottom perspective view of the wafer transfer part.

Next, the wafer transfer part 71 will be described with reference to a top perspective view of FIG. 7 and a bottom perspective view of FIG. 8. The wafer transfer part 71 includes a horizontal square plate-shaped wafer support body (substrate support body) 72, and an arm 73 extending rearward from the back surface side of the wafer support body 72. A front-rear width of the wafer support body 72 is smaller than a diameter of the wafer W. The wafer W is placed on the wafer support body 72 so that a peripheral edge portion of the wafer W protrudes from the front and back of the wafer support body 72 (see FIG. 5).

A guide rail 74 and a roller 75 are provided on the back surface of the arm 73. The guide rail 74 is formed so as to extend linearly in the front-rear direction from the tip end portion (front end portion) of the arm 73 toward the base end side. The roller 75 is located to be spaced apart rearward from the guide rail 74 and is rotatable about a vertical axis. The guide rail 74 is located inside the groove 65 of the slider 63 and can slide back and forth with respect to the groove 65. Further, the roller 75 is located inside the guide groove 67 of the curved rail 66 and can roll on the side wall of the guide groove 67. In this way, the arm 73 is configured as a connection portion connected to the curved rail 66 via the roller 75.

With the above configuration, as the slider 63 moves in the left-right direction, the arm 73 is moved in the left-right direction so that the base end portion thereof is located on the curved rail 66. That is, the wafer support body 72 configured to support the wafer W via the arm 73 moves along the shape of the curved rail 66, and can transfer the wafer W along the transfer path 40B shown in FIG. 1.

Next, the TRS12B, which is a transfer destination of the wafer W transferred by the shuttle 4B shown in FIGS. 5 and 6, will be described. The TRS12B includes a main body portion 77 and an elevating mechanism 78 (shown only in FIG. 2). The elevating mechanism 78 causes the main body portion 77 to move up and down in the vertical direction between an upper position and a lower position. The main body portion 77 includes a pin support 77A formed so as to form a recess opened toward the right side in a plan view, and three pins 77B provided on the pin support 77A. The pin support 77A is located on the lower side of the transfer path 40B. The respective pins 77B extend vertically and are arranged to be spaced apart from each other. As the main body portion 77 is moved up and down with respect to the transfer path 40B by the elevating mechanism 78, the pins 77B can support the peripheral edge portion of the wafer W protruding from the front and back of the wafer support body 72 of the shuttle 4B in a plan view as described above, and can deliver the wafer W between the wafer support body 72 and the TRS12B.

The elevating mechanism 78 includes, for example, a cylinder, a motor and the like, and is provided, for example, on the lower side of the main body portion 77 so as not to interfere with the intermediate moving body 61 and the wafer transfer part 71 of the shuttle 4B, and the main body portion 77 of the TRS12B. Further, the TRS11B has the same configuration as that of the TRS12B except that in this example, the opening of the recess formed by the main body portion 77 in a plan view is oriented to the left. Since the transfer path 40B used by the shuttle 4B is horizontal as described above, the TRS11B and TRS12B are provided at the same height.

Figure 9:
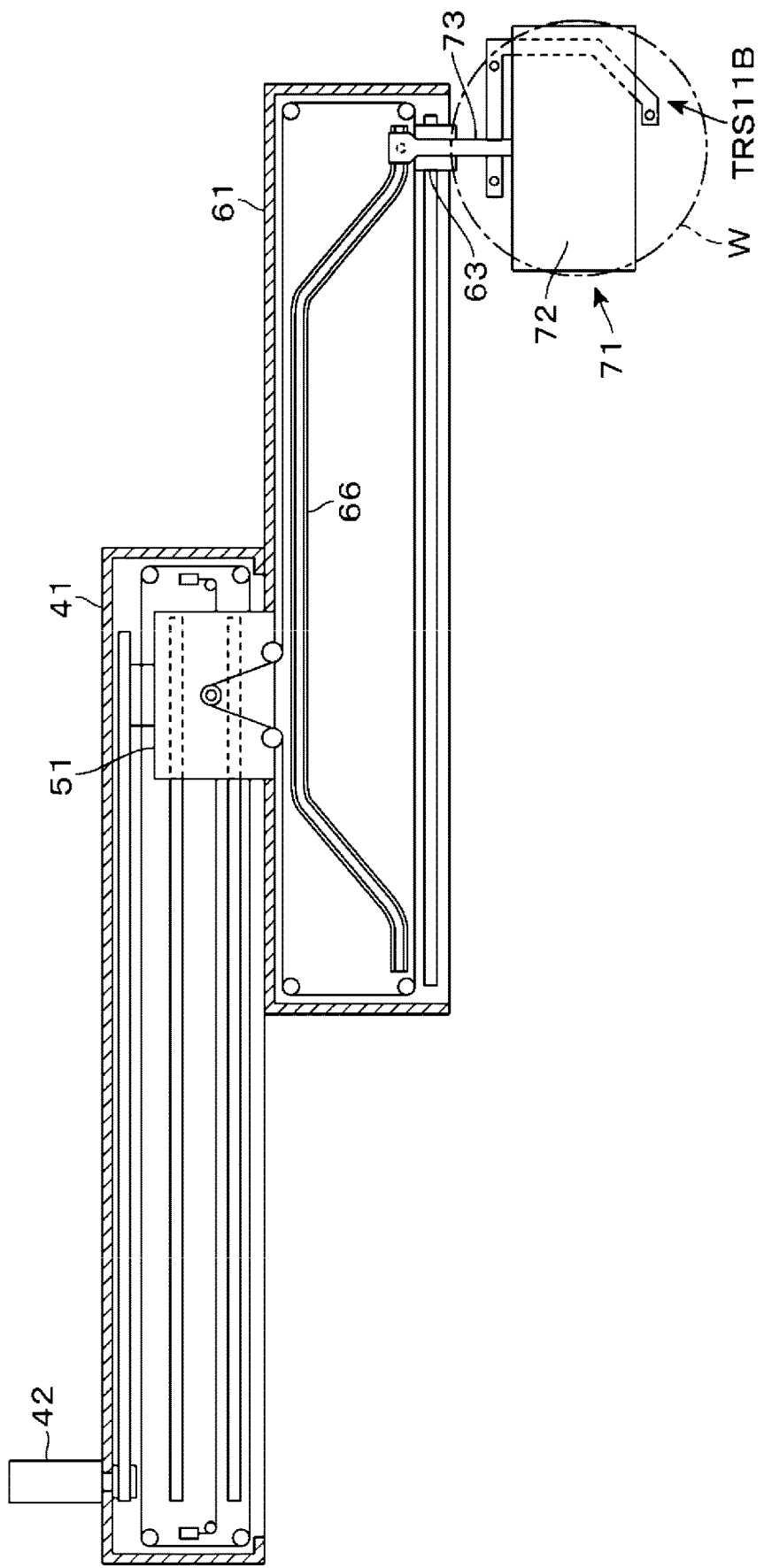
FIG. 9 is a plan view of the shuttle.
Figure 10:
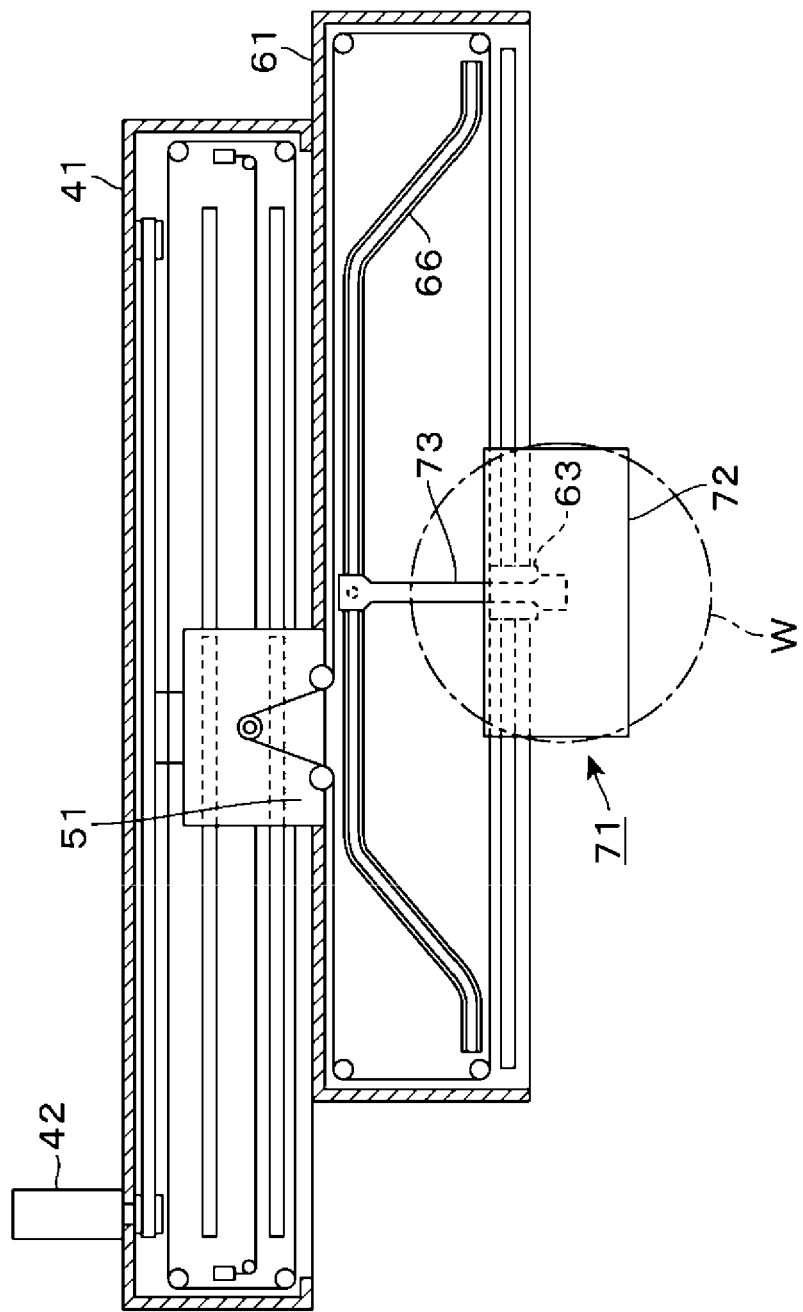
FIG. 10 is a plan view of the shuttle.

The transfer of the wafer W by the shuttle 4B will be described in more detail with reference to FIGS. 9 and 10 and FIG. 5 described above. FIG. 9 shows a state immediately after the wafer transfer part 71 receives the wafer W by moving the main body portion 77 of the TRS11B supporting the wafer W from the upper position to the lower position, i.e., immediately before the wafer W is transferred to the TRS12B. FIG. 10 shows a state in which the wafer W is being transferred to the TRS12B. FIG. 5 shows a state immediately before the main body portion 77 of the TRS12B is moved to the upper position to receive the wafer W, i.e., a state at the end of transferring the wafer W toward TRS12B.

The wafer W that has moved to the left from the position overlapping with TRS11B shown in FIG. 9 (the delivery position with respect to TRS11B and a transfer start position) is moved rearward while moving to the left during the movement. Thereafter, the rearward movement is stopped, and the movement only to the left is performed so that the wafer W passes behind the support column 31 (FIG. 10). Then, when the wafer W is further moved to the left, the wafer W moves forward while moving to the left. Thereafter, the forward movement is stopped, and the movement only to the left is performed so that the wafer W is moved to the position overlapping with TRS12B (the delivery position with respect to TRS12B and a transfer end position) (FIG. 5). After the wafer W is received by the TRS12B by the raising and lowering operation of the TRS12B, the wafer transfer part 71 returns to the TRS11B through the reverse route to the TRS12B and newly receives the wafer W from the TRS11B.

When the wafer W is delivered to the TRS11B as shown in FIG. 9, the right end of the intermediate moving body 61 is located on the right side of the right end of the base body 41, and the right end of the wafer transfer part 71 is located on the right side of the right end of the intermediate moving body 61. When the wafer W is delivered to the TRS12B as shown in FIG. 5, the left end of the intermediate moving body 61 is located on the left side of the left end of the base body 41, and the left end of the wafer transfer part 71 is located on the left side of the left end of the intermediate moving body 61. By moving each of the intermediate moving body 61 and the wafer transfer part 71 in this way, it is possible to reduce the size of the shuttle 4B and hence the size of the substrate processing apparatus 1 while increasing the left-right length of the area where the wafer W can be transferred.

The transfer of the wafer W by the shuttle 4B is performed by changing the left-right relative positions of the plurality of members (the base body 41, the intermediate moving body 61 and the wafer transfer part 71) provided in the front-rear direction as described above. By changing the left-right relative positions of the members in this way, the TRS11B, TRS12B and the shuttle 4B hardly interfere with each other. This contributes to increasing a degree of freedom in the arrangement and design of the TRS11B and TRS12B, and also enhances a degree of freedom in the arrangement of the respective pins 77B. In addition, three or more pins 77B may be provided.

Figure 11:
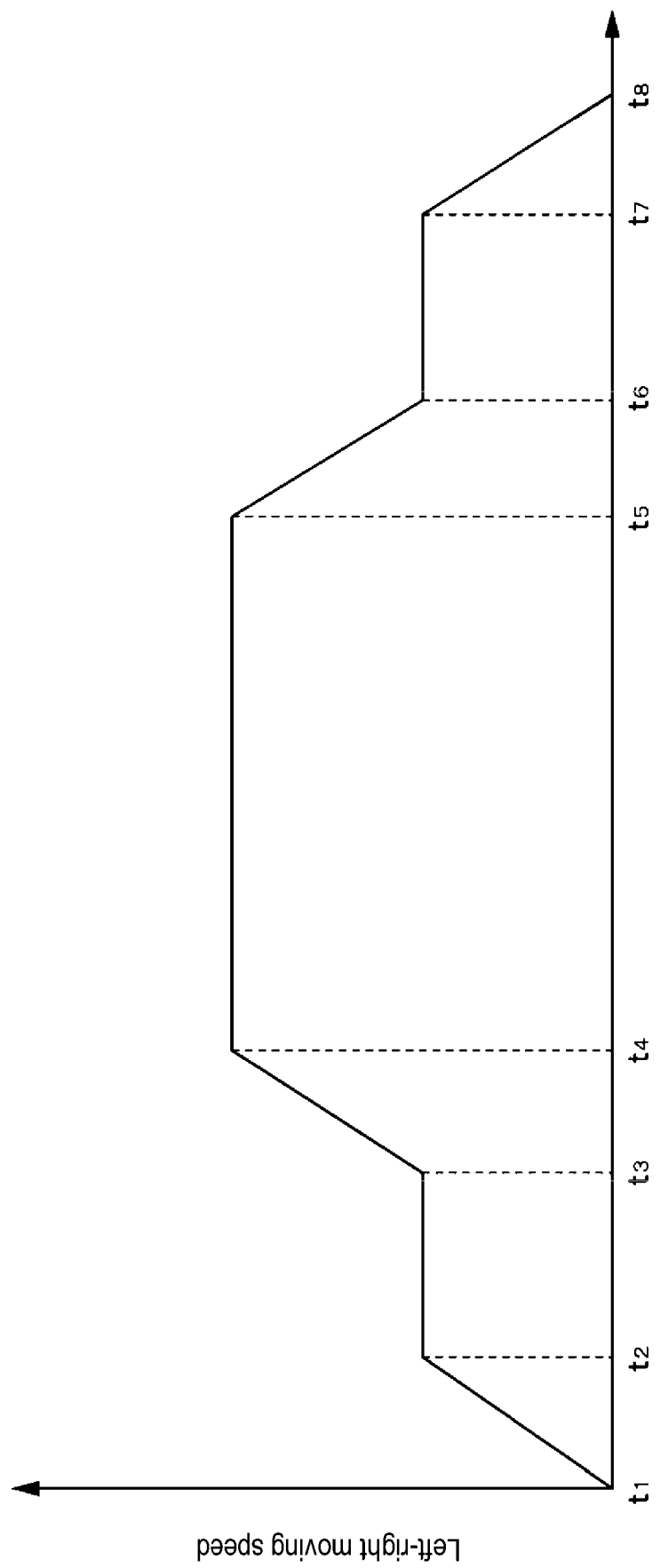
FIG. 11 is a graph showing a movement speed of the shuttle in a left-right direction.
Figure 12:
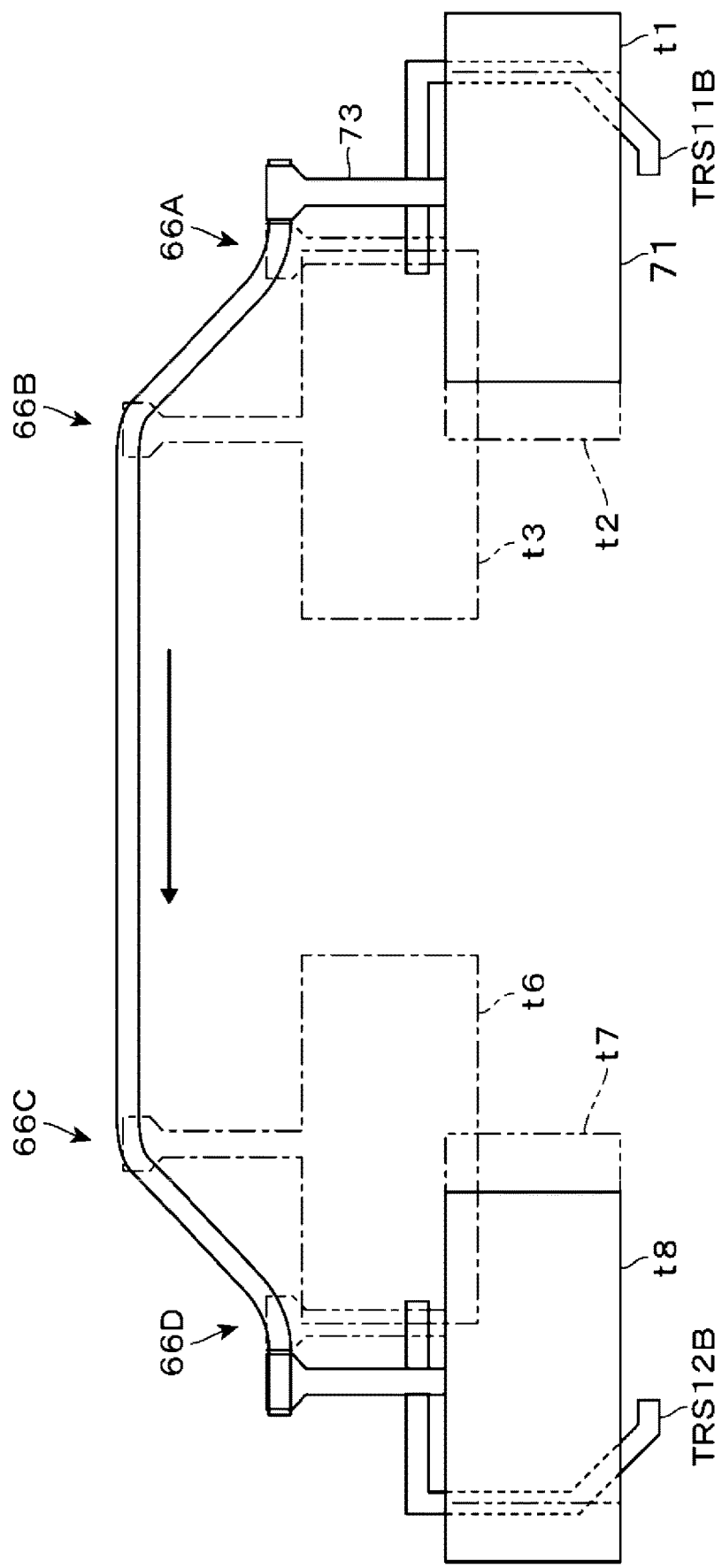
FIG. 12 is an explanatory diagram showing a position of the wafer transfer part.

Next, an example of a speed control when the wafer transfer part 71 moves from the transfer start position to the transfer end position as described above, i.e., an operation control of the motor 42 for moving the wafer transfer part 71 will be described with reference to FIGS. 11 and 12. FIG. 11 is a graph showing a change in the movement speed of the wafer transfer part 71 in the left-right direction during the above-described movement. FIG. 12 shows the wafer transfer part 71 at the respective positions of the curved rail 66 during the above-described movement. In FIG. 12, the wafer transfer part 71 is designated by the same reference numerals as times t1 to t8 in order to correspond to times t1 to t8 attached to the horizontal axis in the graph of FIG. 11. In FIG. 12, the illustration of the wafer transfer part 71 at times t4 and t5 is omitted, and the depiction of the wafer W supported by the wafer transfer part 71 is also omitted. For the sake of convenience in description, four curved portions of the curved rail 66 extending from the transfer start position to the transfer end position are designated as 66A, 66B, 66C and 66D, respectively.

The movement to the left is started from a state in which the wafer transfer part 71 is stopped at the transfer start position (time t1), and the movement speed to the left continues to increase. When the arm 73 of the wafer transfer part 71 reaches the curved portion 66A, the increase in the movement speed is stopped (time t2), and the wafer transfer part 71 is moved to the left at a constant speed. When the arm 73 reaches the curved portion 66B, the movement speed of the wafer transfer part 71 to the left starts to increase again (time t3). Thereafter, the increase in the movement speed is stopped, and the movement speed becomes constant (time t4). Thereafter, just before the arm 73 reaches the curved portion 66C, the movement speed of the wafer transfer part 71 to the left decreases (time t5). When the arm 73 reaches the curved portion 66C, the decrease in the movement speed of the wafer transfer part 71 to the left is stopped, and the movement speed of the wafer transfer part 71 becomes constant (time t6). Thereafter, when the arm 73 reaches the curved portion 66D, the movement speed of the wafer transfer part 71 to the left decreases, and the wafer transfer part 71 reaches the transfer end position at which the movement is stopped (time t7).

In this way, the movement speed of the wafer transfer part 71 in the left-right direction is controlled according to the positions of the curved portions 66A to 66D. More specifically, in the transfer path 40B for the wafer W, a region formed by moving the base end portion of the arm 73 from the curved portion 66A to the curved portion 66B and a region formed by moving the base end portion of the arm 73 from the curved portion 66C to the curved portion 66D (i.e., regions where the wafer W moves back and forth in addition to left and right) are defined as first regions. Further, in the transfer path 40B, a region formed by moving the base end portion of the arm 73 from the curved portion 66B to the curved portion 66C and sandwiched between the two first regions (i.e., a region where the wafer W moves only to left and right) is defined as a second region.

As already described in detail, the movement speed of the wafer W in the left-right direction is controlled to be smaller in each of the first regions than the second region. This is because, in the first regions where the front-rear movement and the left-right movement are performed, the total vector due to the movement in the respective directions acts on the wafer W. That is, if the wafer W is moved at a constant speed in the first regions and the second region, a larger force is applied to the wafer W in the first regions. Therefore, the left-right movement speed is set be higher in the second region than the first regions so as to reliably prevent the wafer W from being displaced or detached from the wafer transfer part 71 in the first regions. From a different point of view, the throughput can be improved by increasing the left-right movement speed of the wafer W in the second region where the front-rear movement is not performed.

When the wafer transfer part 71 returns to the transfer start position on the TRS11B side, there is no wafer W to be supported. Therefore, the movement speed in the left-right direction may be controlled so as to be gradually changed as in the case of moving toward the transfer end position on the TRS12B side. However, such control may not be performed. That is, after the movement speed is increased from the transfer end position where the wafer W is delivered to the TRS12B, the speed increase is stopped and the wafer W is moved at a constant speed. The movement speed is decreased near the transfer start position where the wafer W is delivered to the TRS11B. That is, in a case in which the speed change is indicated by a graph as in FIG. 12, the movement speed is controlled to change so that the graph draws a trapezoid. That is, the number of stages of speed change may be made smaller than that when the wafer W is transferred to the TRS12B, thereby improving the throughput.

Next, the shuttle 4D of the processing block 2D will be described. The shuttle 4D has the same configuration as that of the shuttle 4B except that the connection position of the intermediate moving body 61 with respect to the base body 41 in the left-right direction varies according to the arrangement of the TRS11D and the TRS12D. The speed control is performed as in the shuttle 4B. The TRS11D and TRS12D have the same configuration as those of the TRS11B and the TRS12B, respectively. The main body portion 77 provided with the pins 77B is moved up and down with respect to the transfer path 40D by the elevating mechanism 78.

Figure 13:
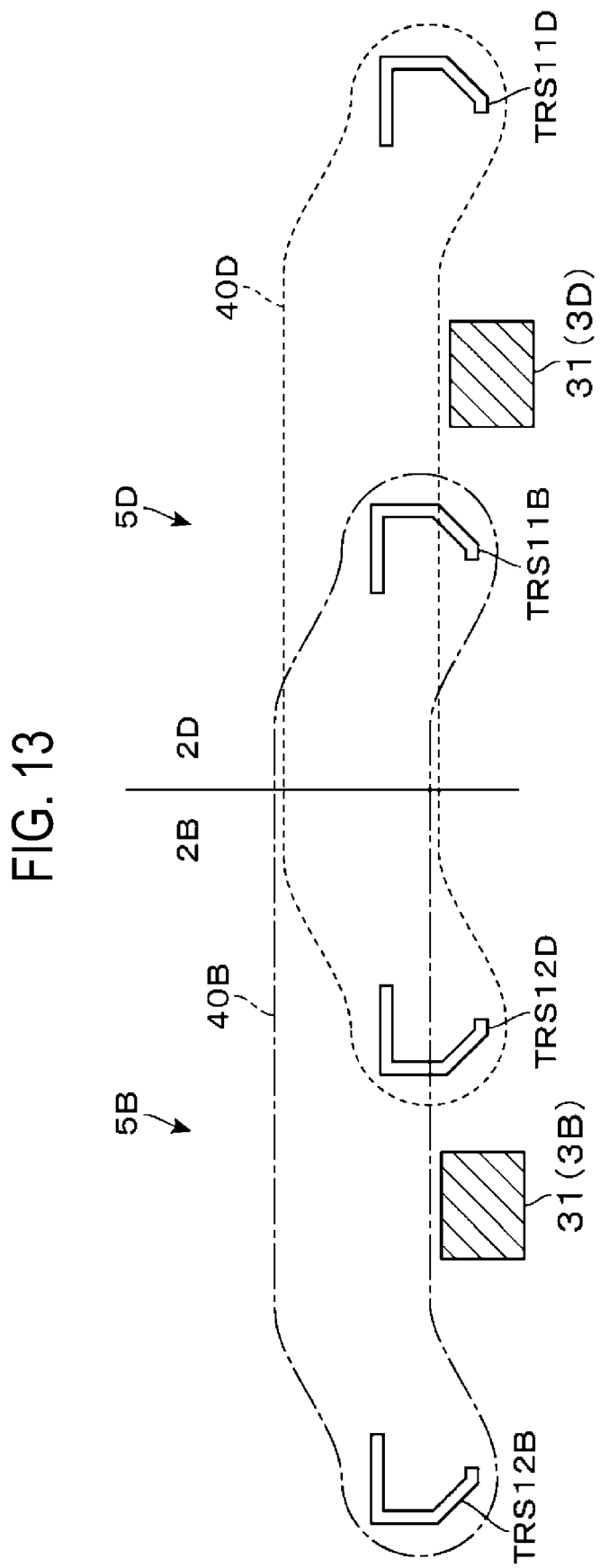
FIG. 13 is a plan view of a wafer transfer path for the shuttle.

A positional relationship between the transfer path 40B of the shuttle 4B and the transfer path 40D of the shuttle 4D will be described with reference to FIG. 13, which is a plan view. As shown by the arrangement of each shuttle TRS described so far, both the transfer paths 40B and 40D are provided from the space 5B of the processing block 2B to the space 5D of the processing block 2D. The set of shuttle 4B, TRS11B and TRS12B, and the set of shuttle 4D, TRS11D and TRS12D are provided at positions displaced from each other in the vertical direction so as not to interfere with each other in the transfer paths 40B and 40D (see FIGS. 2 and 4). That is, the heights of the transfer paths 40B and 40D are different from each other. As shown in FIG. 13, the right end portion of the transfer path 40B and the left end portion of the transfer path 40D overlap each other in a plan view. In this example, the transfer path 40B is arranged on the upper side and the transfer path 40D is arranged on the lower side. However, the arrangement may be reversed.

The substrate processing apparatus 1 includes a controller 10 (see FIG. 1). The controller 10 is composed of a computer and includes a program, a memory, and a CPU. The program includes a group of steps combined so that a series of operations in the substrate processing apparatus 1 can be performed. The controller 10 outputs a control signal to each part of the substrate processing apparatus 1 according to the program so as to control the operation of each part. Specifically, the operations of the main transfer mechanisms 3A to 3D, the shuttles 4B and 4D and the respective processing modules are controlled. As a result, the wafer W is transferred and processed as described later. The operation control for the shuttles 4B and 4D also includes the speed control described above with reference to FIG. 12. Further, the control of the operations of the modules performed by the controller 10 includes performing an abnormality determination based on the image data transmitted from each inspection module. The above program is stored in a non-transitory computer-readable storage medium such as, for example, a compact disk, a hard disk, or a DVD, and is installed in the controller 10.

Figure 14:
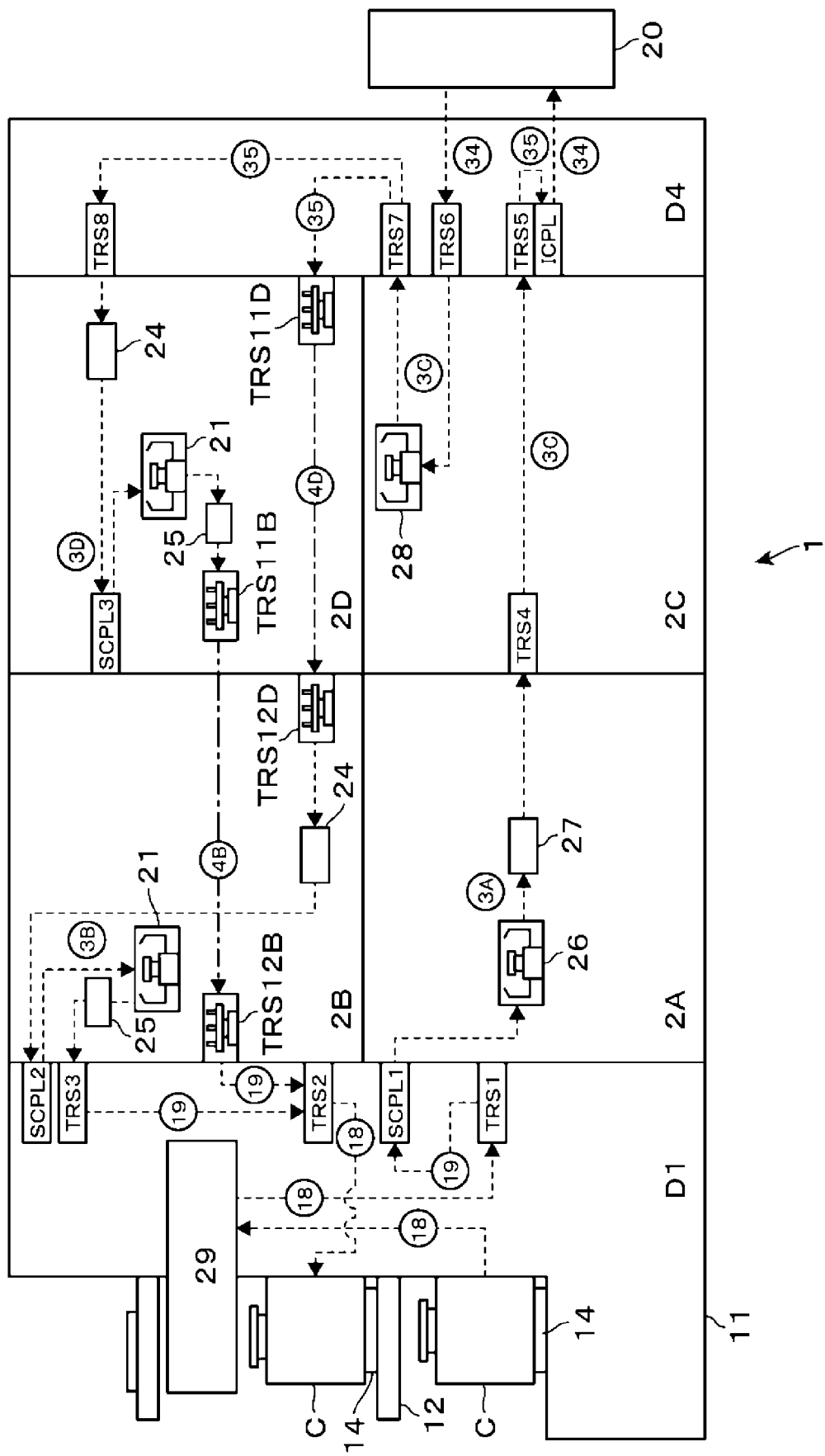
FIG. 14 is an explanatory diagram showing a wafer transfer route in the substrate processing apparatus.

Next, the processing and transfer of the wafer W in the substrate processing apparatus 1 will be described with reference to FIG. 14, which shows the outline of the transfer route. In FIG. 14, the transfer mechanism used for the transfer is depicted on or near a portion of the arrows indicating the transfer of the wafer W between the modules. In this example, it is assumed that the wafer W is discharged from the carrier C on the support base 11 and the processed wafer W is returned toward the carrier C on the support base 12.

First, the wafer W is unloaded from the carrier C on the support base 11 by the transfer mechanism 18, and is transferred inside the carrier block D1 in the order of the pre-process inspection module 29→the transfer mechanism 18→the TRS1→the transfer mechanism 19→the SCPL1. Thereafter, the wafer W is transferred inside the lower processing block in the order of the main transfer mechanism 3A→the back surface cleaning module 26→the main transfer mechanism 3A→the peripheral exposure module 27→the main transfer mechanism 3A→the TRS4→the main transfer mechanism 3C, and is delivered to the TRS5 of the interface block D4. Then, the wafer W is transferred in the order of the transfer mechanism 35→the ICPL→the transfer mechanism 34→the exposure machine 20→the transfer mechanism 35→the TRS6→the main transfer mechanism 3C→the post-exposure cleaning module 28→the main transfer mechanism 3C→the TRS7→the transfer mechanism 35, and is delivered to the interface block D4, the exposure machine 20, and the processing block 2C.

Subsequent transfer routes for the wafer W are divided into a route (one transfer route) for performing a process in the processing block 2D and a route (the other transfer route) for performing a process in the processing block 2B as described above. Explaining the one transfer route, the transfer mechanism 35 of the interface block D4 transfers the wafer W to the TRS8, and the wafer W is taken into the processing block 2D by the main transfer mechanism 3D. The wafer W is transferred in the order of the heating module 24→the SCPL3→the developing module 21→the post-process inspection module 25→the main transfer mechanism 3D. The wafer W is subjected to the formation and inspection of a pattern mask according to the exposure pattern formed in the exposure machine 20. Thereafter, as described with reference to FIGS. 5, 9 and 10, the wafer W is transferred in the order of the TRS11B→the shuttle 4B→the TRS12B. The transfer mechanism 19 of the carrier block D1 receives the wafer W and transfers the wafer W to the TRS2 of the module stack T1.

Explaining the other transfer route, the wafer W is transferred in the order of the transfer mechanism 35→the TRS11D→the shuttle 4D→the TRS12D→the main transfer mechanism 3B, and is taken into the processing block 2B. Then, the wafer W is transferred in the order of the heating module 24→the SCPL3→the developing module 21→the post-process inspection module 25 by the main transfer mechanism 3B. The wafer W is processed in the same manner as the wafer W transferred to the processing block 2D, and is then transferred to the TRS3 of the carrier block D1. Subsequently, the wafer W is transferred to the TRS2 by the transfer mechanism 19. In these two transfer routes, the wafer W transferred to the TRS2 is transferred to the carrier C on the support base 12 by the transfer mechanism 18.

Since the substrate processing apparatus 1 is configured as described above and the transfer is performed as described above, the main transfer mechanism 3B of the processing block 2B and the main transfer mechanism 3D of the processing block 2D do not need to transfer the wafer W, which is not processed in the block where the main transfer mechanisms 3B and 3D are provided, toward the carrier block D1. That is, the load of each of the main transfer mechanisms 3B and 3D, more specifically, the number of transfer steps required in the block is reduced. As described above, a large number of modules are provided in each of the processing block 2B and the processing block 2D. By reducing the load in this way, the main transfer mechanisms 3B and 3D can quickly access each module, can receive the wafer W, and can transfer the wafer W to the module on the downstream side. That is, in the substrate processing apparatus 1, the wafer W can be processed by a large number of processing modules, and the wafer W can be quickly transferred between the modules. Therefore, according to the substrate processing apparatus 1, it is possible to enhance the throughput.

In addition to the main transfer mechanisms 3B and 3D, the processing blocks 2B and 2D are provided with the shuttles 4B and 4D, respectively, so that the main transfer mechanisms 3B and 3D do not need to move across the blocks arranged side by side in the left-right direction. The transfer path 40B of the shuttle 4B protrudes toward the processing block 2D, and the transfer path 40D of the shuttle 4D protrudes toward the processing block 2B. The transfer paths 40B and 40D provided over the blocks adjacent to the left and right are offset in height from each other and do not intersect with each other. Therefore, the transfer by the shuttle 4B and the transfer by the shuttle 4D can be performed independently of each other. More specifically, during the transfer by one of the shuttles 4A and 4B, it is not necessary to stop the transfer by the other shuttle in order to avoid interference with one shuttle. Therefore, the throughput of the substrate processing apparatus 1 can be increased more reliably. Since the transfer paths 40B and 40D having such a height offset overlap in a plan view, it is possible to prevent an increase in the front-rear width of the substrate processing apparatus 1, reduce the footprint of the substrate processing apparatus 1, and save the space.

It is necessary to set the height of the substrate processing apparatus 1 so as not to interfere with the ceiling of the clean room. Meanwhile, the liquid processing module such as the developing module 21 or the like includes a cup (not shown) for storing the wafer W. Therefore, the height of the liquid processing module is relatively large. However, in the substrate processing apparatus 1, the shuttles 4B and 4D are provided so as to overlap with the processing module stack 23 that performs a process different from the liquid process described above. At the height of the apparatus limited for that purpose, it is possible to sufficiently secure the height of the transfer region 22 so that the number of stories in which the liquid processing modules are provided can be increased and the wafer W can be delivered to each of the stories. Therefore, according to the substrate processing apparatus 1, the throughput of the wafer W can be enhanced more reliably.

Further, the shuttles 4B and 4D are located below the processing module stack 23 in the upper processing block, i.e., at a height on the lower processing block side. That is, the shuttles 4B and 4D are provided on the side of one of the upper processing block and the lower processing block connected to the processing module stack 23 from below with respect to the block provided with the bypass transfer path for the shuttle. It is assumed that the shuttle 4B and 4D are provided at a relatively high position in the upper processing block, and each of the TRSs for the shuttle 4B and 4D is also provided at a relatively high position. In that case, it is necessary to move the transfer mechanisms 19 and 35 that deliver the wafer W to the TRS12B and the TRS11D, to the positions above the positions of the modules constituting the module stacks T1 and T3, respectively. That is, if the shuttles 4B and 4D are provided at the height on the lower processing block side with respect to the processing module stack 23 as described above, it is possible to reduce the amount of vertical movement of the transfer mechanisms 19 and 35. Therefore, the arrangement of the shuttles 4B and 4D contributes to increasing the throughput more reliably.

As described above, the transfer path 40B for the shuttle 4B and the transfer path 40D for the shuttle 4D bypass the support columns 31 of the main transfer mechanisms 3B and 3D, respectively. It is conceivable that the transfer paths 40B and 40D are provided linearly so as to pass through the rear side of the support column 31 without making such a bypass route, and the amount of lateral movement of the transfer mechanism other than the shuttle is increased so that the wafer W is delivered to and from the shuttles 4B and 4D. However, in such a configuration, the footprint of the substrate processing apparatus 1 becomes large. Therefore, since the transfer paths 40B and 40D are used as bypass paths for the support columns 31 as described above, the increase in the size of the substrate processing apparatus 1 can be prevented. From another point of view, since the shuttles 4B and 4D form the bypath paths for the support columns 31 in this way, it is not necessary to shift the front-rear positions of the support columns 31 and the processing module stack 23. Therefore, it is possible to suppress the increase in the front-rear width of the substrate processing apparatus 1 and prevent the increase in the size of the substrate processing apparatus 1.

Further, the shuttles 4B and 4D have a configuration in which the left-right relative position of the base body 41, the intermediate moving body 61 and the wafer transfer part 71 is changed as described above. By changing the relative position in this way, the shuttles 4B and 4D can be brought into a state in which these members (the base body 41, the intermediate moving body 61 and the wafer transfer part 71) are accommodated in the processing blocks 2B and D, respectively. Accordingly, when the processing block 2B and the processing block 2D are assembled at the apparatus manufacturing factory and are then transferred to the clean room where the substrate processing apparatus 1 is installed, it is possible to reduce the left-right width of each of the processing block 2B and the processing block 2D. Therefore, it is possible to simplify the labor and equipment for transportation. Further, the transfer of the shuttles 4B and 4D accommodated in the processing blocks 2B and 2D in this way contributes to promptly assembling and operating the apparatus at the transfer destination.

Then, the intermediate moving body 61 and the wafer transfer part 71 are moved by using the motor 42 provided in the base body 41 as a common drive source. Since the drive source is common in this way, it is possible to reduce the manufacturing cost and simplify the apparatus configuration. The shuttles 4B and 4D have a configuration in which the arm 73 of the wafer transfer part 71 moves along the curved rail 66 as described above. With this configuration, the driving force of the motor 42, which is the above-mentioned drive source, can be transmitted to the arm 73 to perform left-right movement and front-rear movement without providing drive sources for left-right movement and front-rear movement of the arm 73. This is also advantageous in that it is possible to avoid complication of the apparatus configuration and prevent an increase in the manufacturing cost.

The slider 63 is provided on the front side (the side on which the wafer support body 72 is located) of the curved rail 66 for controlling the movement trajectory of the arm 73. The arm 73 is supported by the slider 63 and is moved along the guide rail 74. Therefore, the arm 73 is supported in the vicinity of the wafer support body 72. Accordingly, the increase in the load of the arm 73 due to the weight of the arm 73 and the weight of the wafer W is suppressed, the deterioration of each part constituting the shuttles 4B and 4D is suppressed, and the fluctuation of the operation of the arm 73 is suppressed. This configuration makes it possible to transfer the wafer W to a desired position at the transfer destination with high accuracy.

The TRS11D for shuttle may be arranged in the interface block D4 so that the shuttle 4D is moved from the interface block D4 to the TRS11D of the processing block 2B through the processing block 2D. Further, the TRS12B for shuttle may be arranged in the carrier block D1 so that the shuttle 4B is moved from the TRS11B of the processing block 2D to the TRS11B through the processing block 2B. That is, each TRS for shuttle is not limited to being provided in the processing block. The shuttle is used for transferring the wafer W toward the block on the downstream side of the transfer route for the wafer W between one side and the other side of the blocks arranged side by side in the left-right direction, and is not limited to the configuration in which, as shown in the substrate processing apparatus 1, the wafer W is transferred between the blocks adjacent in the left-right direction.

Modification of the First Embodiment

Figure 15:
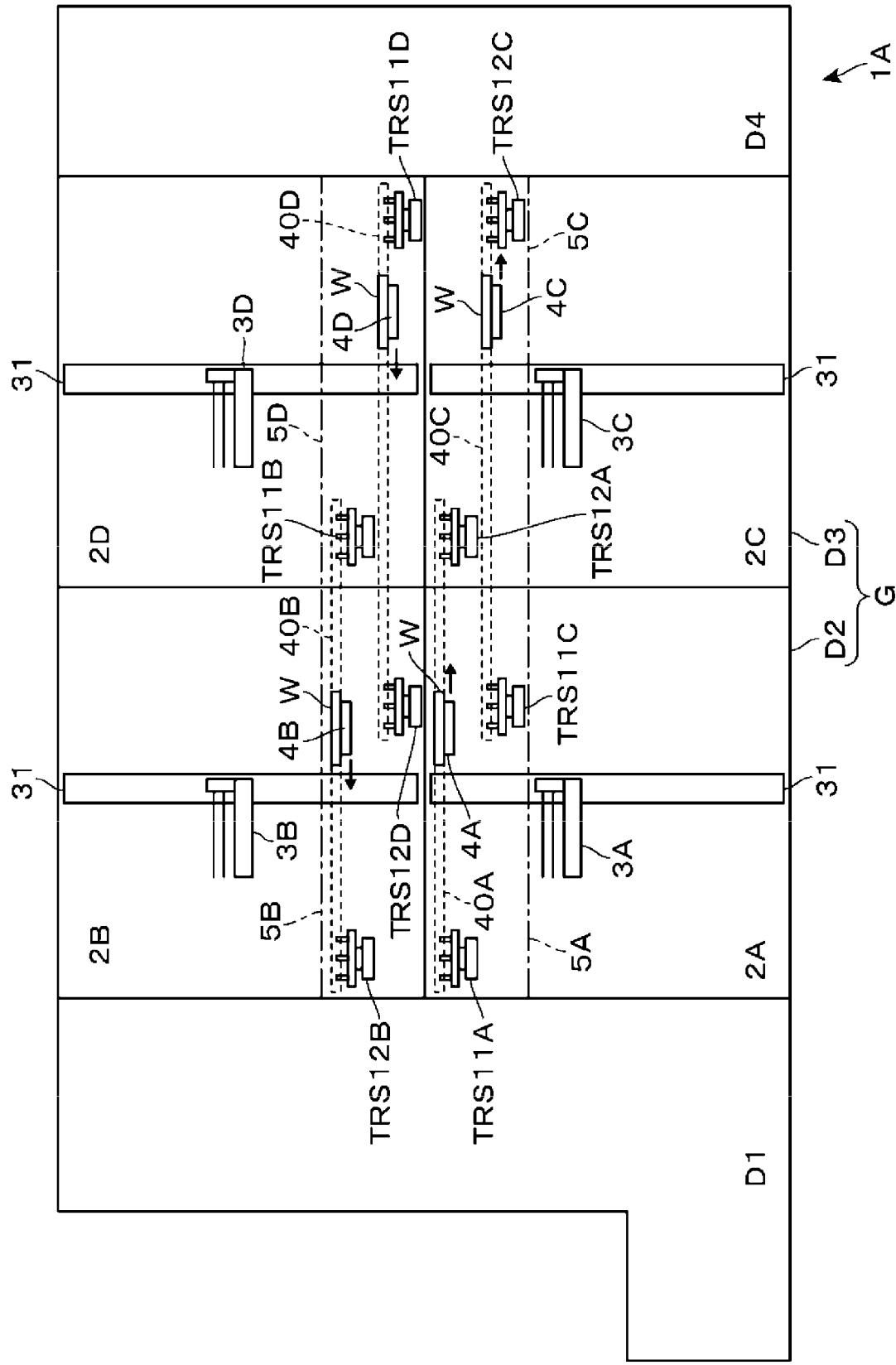
FIG. 15 is a schematic front view showing a modification of the substrate processing apparatus.

Although the example in which the shuttle and the TRS for shuttle are provided on the return path has been described, it may be possible to adopt an apparatus configuration in which the shuttle and the TRS for shuttle are provided on the outgoing path. FIG. 15 shows a schematic front view of a substrate processing apparatus 1A provided with shuttles and TRSs for shuttle on an outgoing path and a return path. Hereinafter, differences from the substrate processing apparatus 1 will be mainly described. Lower processing blocks 2A and 2C of the substrate processing apparatus 1A are provided with similar processing modules. For example, the liquid processing module includes a resist film forming module, and the processing module stack 23 includes a heating module used after forming a resist film.

A shuttle 4A, a TRS11A and a TRS11C are provided at the front positions of the processing block 2A in the space 5A, and a shuttle 4C, a TRS12A and a TRS12C are provided at the front positions of the processing block 2C in the space 5C. In the space 5A, the TRS11A and the TRS11C are provided sequentially toward the right side so as to sandwich the support column 31 of the main transfer mechanism 3A. In the space 5C, the TRS12A and TRS12C are provided sequentially toward the right side so as to sandwich the support column 31 of the main transfer mechanism 3C. A height of the set of the shuttle 4A, the TRS11A and the TRS12A and a height of the set of the shuttle 4C, the TRS11C and the TRS12C are different from each other.

Since the layout of the respective members is as described above, the transfer path 40A of the shuttle 4A and the transfer path 40C of the shuttle 4C have the same positional relationship as the transfer paths 40B and 40D described above with reference to FIG. 13. That is, the heights of the transfer paths 40A and 40C are different from each other, and the end portions thereof overlap each other in a plan view. The reason for providing the shuttle and the TRS for shuttle above the processing module stack 23 in the lower processing blocks 2A and 2C is the same as the reason for providing the shuttle and the TRS for shuttle below the processing module stack 23 in the upper processing blocks 2B and 2D. That is, the reason is to prevent an increase in the movement range of the transfer mechanisms 19 and 35.

The two transfer routes of the outgoing path in the substrate processing apparatus 1B will be described. In one transfer route, the wafer W unloaded from the carrier C and transferred to the module stack T1 of the carrier block D1 is received by the main transfer mechanism 3A, processed in the processing block 2A, and then transferred in the order of the TRS11C→the shuttle 4C→the TRS12C→the interface block D4. In the other transfer route, the wafer W unloaded from the carrier C is transferred in the order of the transfer mechanism 19 of the carrier block D1→the TRS11A→the shuttle 4A→the TRS12A→the main transfer mechanism 3C, processed in the processing block 2C, and then transferred to the interface block D4. The transfer of the wafer W by the shuttles 4A and 4C on the outgoing paths is performed so as to bypass the support column 31 of the main transfer mechanism 3B and the support column 31 of the main transfer mechanism 3D, respectively, as in the case of the transfer of the wafer W by the shuttles 4B and 4D on the return path.

Second Embodiment

Figure 16:
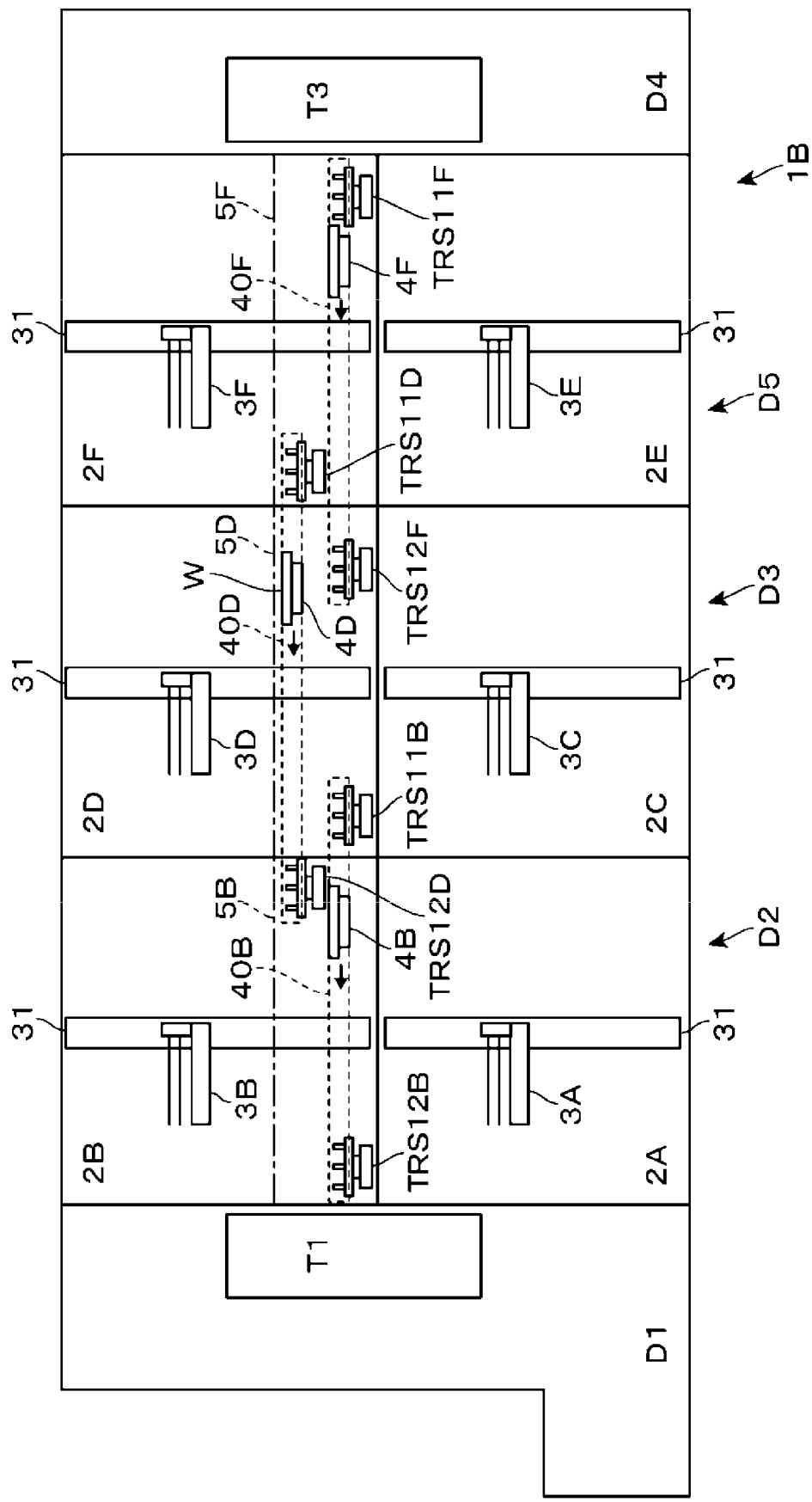
FIG. 16 is a schematic front view of a substrate processing apparatus according to a second embodiment.

The number of processing blocks adjacent to each other in the lateral direction and provided with the shuttle may be three or more. FIG. 16 is a schematic front view of a substrate processing apparatus 1B according to a second embodiment, which is provided with three processing blocks. The substrate processing apparatus 1B is, for example, an apparatus that performs the same processing as the substrate processing apparatus 1 according to the first embodiment. Differences from the substrate processing apparatus 1 will be mainly described below.

In the substrate processing apparatus 1B, a third multilayered processing block D5 is provided between the second multilayered processing block D3 and the interface block D4 so as to be adjacent to these blocks D3 and D4. A processing station G is composed of the first to third multilayered processing blocks D2, D3 and D5. The third multilayered processing block D5 has the same configuration as that of the first multilayered processing block D3, and is composed of a lower processing block 2E and an upper processing block 2F. On the return path, the wafer W is processed by one of the processing blocks 2B, 2D and 2F. The processing blocks 2B, 2D and 2F are a first processing block, a second processing block and a third processing block, respectively. The shuttles 4B, 4D and 4F are a first bypass transfer mechanism, a second bypass transfer mechanism and a third bypass transfer mechanism, respectively. The transfer paths 40B, 40D and 40F are a first bypass transfer path, a second bypass transfer path and a third bypass transfer path, respectively.

A TRS11F and a TRS11D are provided on the right side and left side of the support column 31 of the main transfer mechanism 3F in a space 5F for installation of the shuttle 4F in the processing block 2F. The transfer mechanism 35 of the interface block D4 is accessible to the TRS11F. Further, in the space 5D, a TRS12F is provided on the right side of the support column 31 of the main transfer mechanism 3D.

Figure 17:
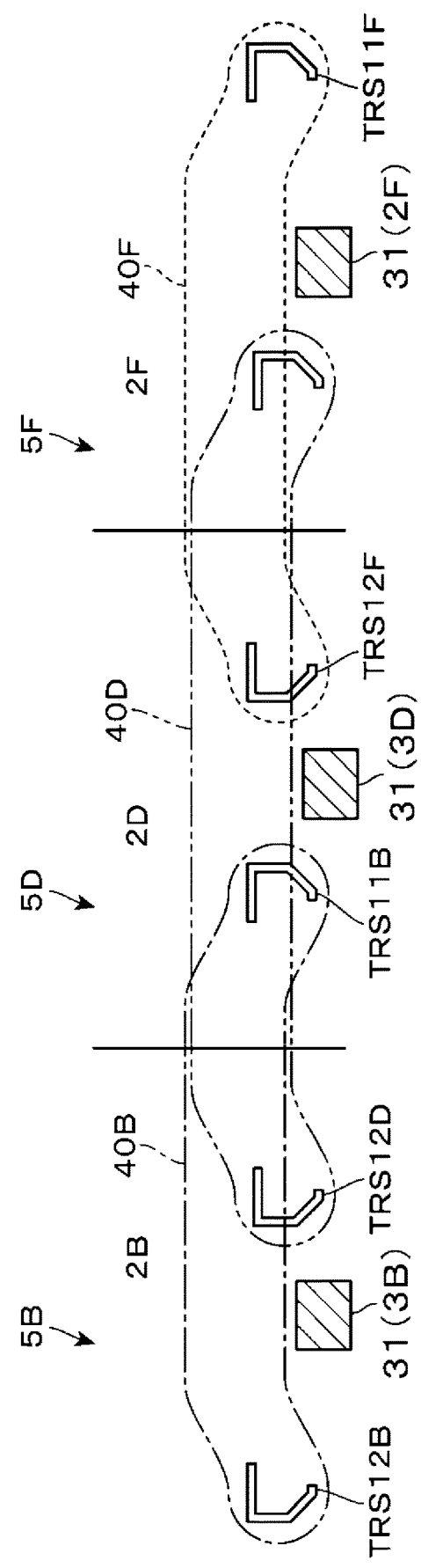
FIG. 17 is an explanatory diagram showing a wafer transfer route in the substrate processing apparatus.

In a set of the shuttle 4B, the TRS11B and the TRS12B (referred to as a first set), a set of the shuttle 4D, the TRS11D and the TRS12D (referred to as a second set), and a set of the shuttle 4F, the TRS11F and the TRS12F (referred to as a third set), a height of the second set is different from heights of the first and third sets. In this example, the second set is located above the first and third sets, and the first set and the third set are provided at the same height as each other. Therefore, the transfer paths 40B and 40F are located at the same height as each other, and the transfer path 40D is located higher than the transfer paths 40B and 40F. As shown in FIG. 17, in a plan view, the right end portion of the transfer path 40B and the left end portion of the transfer path 40D overlap each other, and the right end portion of the transfer path 40D and the left end portion of the transfer path 40F overlap each other.

An example of the transfer route on the return path will be described. When the wafer W is processed in the processing block 2F, the wafer W is transferred in the order of the module stack T3 of the interface block D4→the main transfer mechanism 3F, processed by each processing module of the processing block 2F, and then transferred to the TRS11D. Then, the wafer W is transferred in the order of the shuttle 4D→the TRS12D→the main transfer mechanism 3B→the module stack T1 of the carrier block D1.

When the wafer W is processed in the processing block 2D, the wafer W is transferred in the order of the transfer mechanism 35 of the interface block D4→the TRS11F→the shuttle 4F→the TRS12F→the main transfer mechanism 3D, processed by each processing module of the processing block 2D, then transferred in the order of the TRS11B→the shuttle 4B→the TRS12B, and transferred to the carrier block D1. When the wafer W is processed in the processing block 2B, the wafer W is transferred in the order of the module laminate T3→the main transfer mechanism 3F→the TRS11D→the shuttle 4D→the TRS12D→the main transfer mechanism 3B, processed by each processing module of the processing block 2B, and then transferred to the module stack T1.

In the substrate processing apparatus 1B, a module stack corresponding to the module stack T2 is provided so as to straddle the second multilayered processing block D3 and the third multilayered processing block D5. It is assumed that the wafer W can be transferred in the lower processing blocks 2A, 2C and 2E by using each module stack, and the outgoing path is formed by the processing blocks 2A, 2C and 2E.

In the above-mentioned substrate processing apparatus 1B, in order to transfer the wafer W between the upper processing blocks, the end portion of the transfer path 40D overlaps each of the transfer paths 40B and 40F in a plan view as described above. By arranging the transfer path 40D at a position higher than each of the transfer paths 40B and 40F as described above, the height required for the installation of the transfer paths 40B, 40D and 40F can be made smaller than when installing the transfer paths 40B, 40D and 40F sequentially in the vertical direction. Therefore, it is possible to prevent the substrate processing apparatus 1B from becoming large in size. The transfer path 40D may be provided below the transfer paths 40B and 40F. In both cases in which the transfer path 40D is provided on the upper side and the lower side of the transfer path 40B and 40F, from the viewpoint of suppressing the height of the apparatus, it is preferable that the transfer paths 40B and 40F have the same or substantially the same height.

In this substrate processing apparatus 1B, shuttles may be provided in the lower processing blocks 2A, 2C and 2E. Just like the transfer between the upper processing blocks 2B, 2D and 2F, the wafer W may be transferred so that the wafer W is processed in a desired one of the processing blocks 2A, 2C and 2E. Even in that case, it is preferable that the transfer paths 40A, 40C and 40E for the shuttle of the lower processing block have the same positional relationship as the transfer paths 40B, 40D and 40F for the shuttle of the upper processing block. That is, it is preferable that the transfer path 40D, which is a left-right central transfer path, is provided on the upper side or the lower side of the transfer paths 40B and 40F, and it is more preferable that the transfer paths 40B and 40F have the same height.

In the configuration example of each apparatus described above, the TRS for shuttle is provided. Alternatively, it may be possible to adopt an apparatus configuration in which the TRS for shuttle is not provided so that the wafer W can be directly delivered between each transfer mechanism and the shuttle. However, if the TRS for shuttle is not provided in this way, each transfer mechanism and the shuttle will wait while supporting the wafer W. Therefore, it is preferable to provide the TRS for shuttle in order to improve the throughput.

Further, in each of the above-described apparatuses, the liquid processing module is located on the front side, and the processing module stack 23 is located on the rear side. However, this layout may be reversed in the left-right direction. The left-right layout of the apparatus may be reversed from the above-described example. Further, the interface block D4 may not transfer the wafer W to the exposure machine 20, but may transfer the wafer W only vertically between the height of the lower processing block and the height of the upper processing block. Further, the upper processing block and the lower processing block may not be directly connected to the carrier block D1 for loading and unloading the wafer W into and from the apparatus. For example, it may be possible to adopt a configuration in which a block for transferring the wafer W up and down may be interposed between the carrier block D1 and the upper and lower processing blocks. Further, the processing blocks are not limited to having a vertically stacked structure. For example, one of the outgoing path and the return path may be formed so that the wafer W is transferred by the main transfer mechanism, and the other may be formed so that the wafer W is transferred by the shuttle.

Further, in each shuttle, for example, the curved rail 66, the guide rail 69 and the slider 63 are provided on the base body 41 instead of the intermediate moving body 61. Then, an arm corresponding to the arm 73 is connected to the curved rail 66 and the slider 63, and is connected to the belt 46 driven by the motor 42. Further, it may be possible to adopt a configuration in which the intermediate moving body 61 is connected to the front end portion of the arm, and the intermediate moving body 61 is moved along the curved rail 66 together with the wafer support body 72 connected to the front side thereof. In that case, a power transmission mechanism including a pulley, a belt, a gearbox, and the like may be provided in the slider 63, the arm and the intermediate moving body 61, whereby the left-right position of the wafer support body 72 with respect to the intermediate moving body 61 may be changed according to the change in the left-right position of the slider 63. As described above, the curved rail 66 shown in FIG. 5 or the like is not limited to the configuration of the shuttle provided in the intermediate moving body 61.

In the shuttle shown in FIG. 5 and the like, instead of providing the groove 65 in the slider 63 of the intermediate moving body 61 and providing the guide rail 74 in the arm 73, the guide rail 74 may be provided in the slider 63 and the groove 65 may be provided in the arm 73. Further, the roller 75 of the arm 73 recessed into the guide groove 67 of the curved rail 66 may be provided with a circular protrusion made of a material having a sufficiently low coefficient of friction with respect to the curved rail 66 instead of the roller 75. Moreover, instead of the curved rail 66, a thick plate having a guide groove 67 formed on the upper surface thereof may be used. The guide member for guiding the wafer transfer part 71 is not limited to the rail. Further, in the configuration example described above, the wafer support body 72 is connected to the curved rail 66 via the arm 73, and the wafer support body 72 is moved to follow the arm 73. However, the member corresponding to the arm 73 may not be provided. That is, the wafer support body 72 may be directly connected to the curved rail 66, and the wafer support body 72 may be configured to serve as a connection portion. In that case, the guide rail 74 previously provided on the arm 73 may be provided on the wafer support body 72. The shuttle configuration described above can be changed as appropriate.

FIG. 5 shows that, when the shuttle 4B delivers the wafer W to the TRS12B, two of the three pins 77B of the TRS11B sandwich the arm 73 in a plan view. All of the two pins 77B may be provided on the left side of the arm 73. Due to the arrangement of the pins 77B and the concave shape of the main body portion 77 opened to the right side, the main body portion 77 of the TRS11B can be moved to the upper position so that the pins 77B support the wafer W. Then, before the main body portion 77 of the TRS11B returns to the lower position, the wafer transfer part 71 of the shuttle 4B can start moving toward the TRS11B. That is, when the TRS11B receives the wafer W, the TRS11B is configured so that the constituent members of the TRS11B are not positioned as viewed from the wafer transfer part 71 in the traveling direction (in this case, to the right), thereby preventing mutual interference. As a result, the timing of starting the movement of the wafer transfer part 71 can be advanced, and the throughput of the apparatus can be improved. Similarly, when the wafer W is delivered to the TRS11B in FIG. 9, two of the three pins 77B of the TRS11B are shown to sandwich the arm 73 in a plan view. However, theses pins 77B may be provided on the right side of the arm 73.

According to the present disclosure in some embodiments, it is possible to increase the throughput and save a space in a substrate processing apparatus.

The liquid process performed by the substrate processing apparatus is not limited to the above-described example, and may include, for example, a process of forming an insulating film by coating a chemical solution, a process of coating an adhesive to bond wafers W to each other, and the like. The embodiments disclosed herein should be considered to be exemplary and not limitative in all respects. The above-described embodiments may be omitted, replaced, modified, and/or combined in various forms without departing from the scope of the appended claims and their gist.

What is claimed is:

1. A substrate processing apparatus, comprising:
    a loading/unloading block in which a substrate is loaded and unloaded;
    a processing station provided on one of left and right sides of the loading/unloading block, and in which the substrate is transferred to and from the loading/unloading block;
    a relay block provided on one of left and right sides of the processing station, and in which the substrate is transferred to and from the processing station;
    a plurality of processing blocks provided side by side in a left-right direction to form the processing station, each of the plurality of processing blocks including at least one processing module that performs a process on the substrate and a main transfer mechanism that delivers the substrate to the at least one processing module; and
    a plurality of bypass transfer mechanisms provided separately from the main transfer mechanism and provided respectively for the plurality of processing blocks arranged side by side in the left-right direction to transfer the substrate between left and right blocks,
    wherein a plurality of bypass transfer paths, which are transfer paths for the substrate transferred by the plurality of bypass transfer mechanisms, have heights different from each other, and partially overlap each other in a plan view, and
    wherein each of the plurality of bypass transfer mechanisms includes a base body provided in each of the plurality of processing blocks, a first moving body that moves in the left-right direction with respect to the base body, and a substrate support body that supports the substrate and moves in the left-right direction with respect to the first moving body.

2. The substrate processing apparatus of claim 1, wherein the plurality of processing blocks include at least three processing blocks including a first processing block, a second processing block and a third processing block arranged sequentially from one of the left and right sides to the other, and the plurality of bypass transfer paths for the plurality of bypass transfer mechanisms include a first bypass transfer path, a second bypass transfer path and a third bypass transfer path,
    wherein the second bypass transfer path has a left end portion overlapping with one bypass transfer path of the first bypass transfer path and the third bypass transfer path in the plan view, and a right end portion overlapping with the other bypass transfer path of the first bypass transfer path and the third bypass transfer path in the plan view, and
    wherein the first bypass transfer path and the third bypass transfer path are located above or below the second bypass transfer path.

3. The substrate processing apparatus of claim 1, further comprising:
    substrate placement parts each of which places the substrate thereon and moves up and down with respect to an end portion of each of the plurality of bypass transfer paths to deliver the substrate to each of the plurality of bypass transfer mechanisms.

4. The substrate processing apparatus of claim 1, wherein the at least one processing module includes a plurality of processing modules provided side by side in the left-right direction,
    the main transfer mechanism includes a column provided between the plurality of processing modules in the plan view, and
    each of the plurality of bypass transfer paths includes a transfer path extending in a front-rear direction and is a bypass path through which the substrate bypasses the column.

5. The substrate processing apparatus of claim 4, wherein a guide member for guiding a front-rear movement and a left-right movement of the substrate support body is provided on one of the base body and the first moving body.

6. The substrate processing apparatus of claim 5, wherein the guide member is a curved rail, and the substrate support body is movable along the curved rail so as to form the bypass path.

7. The substrate processing apparatus of claim 6, wherein a connection portion, which is connected to the guide member and movable in the left-right direction and the front-rear direction together with the substrate support body, and a second moving body, which is connected to the connection portion and movable in the left-right direction, are provided on a side of the base body and the first moving body where the guide member is provided, and
    a rail extending in the front-rear direction is provided in one of the connection portion and the second moving body to cause one of the connection portion and the second moving body to slide in the front-rear direction with respect to the other of the connection portion and the second moving body.

8. The substrate processing apparatus of claim 7, wherein the rail extending in the front-rear direction is provided in the connection portion.

9. The substrate processing apparatus of claim 4, wherein each of the plurality of bypass transfer paths includes two first regions that transfer the substrate in the left-right direction and the front-rear direction and a second region sandwiched between the two first regions and transferring the substrate in the left-right direction, and a movement speed of the substrate in the left-right direction in the two first regions is smaller than a movement speed of the substrate in the left-right direction in the second region.

10. A substrate processing method, comprising:
loading and unloading a substrate into and from a loading/unloading block;
transferring the substrate between a processing station provided on one of left and right sides of the loading/unloading block and the loading/unloading block;
transferring the substrate between a relay block provided on one of left and right sides of the processing station and the processing station;
in each of a plurality of processing blocks provided side by side in a left-right direction to form the processing station and including a processing module, a main transfer mechanism and a bypass transfer mechanism transferring the substrate independently of the main transfer mechanism, delivering the substrate to the processing module by the main transfer mechanism and processing the substrate in the processing module; and
transferring the substrate between left and right blocks by using bypass transfer paths which are transfer paths for the substrate transferred by the bypass transfer mechanism, have heights different from each other, and partially overlap each other in a plan view,
wherein the bypass transfer mechanism includes a base body provided in each of the plurality of processing blocks, a first moving body that moves in the left-right direction with respect to the base body, and a substrate support body that supports the substrate and moves in the left-right direction with respect to the first moving body.

* * * * *